(12) United States Patent
Woo et al.

(10) Patent No.: US 10,019,041 B2
(45) Date of Patent: Jul. 10, 2018

(54) SOLID STATE DRIVE (SSD) HOUSING AND SSD HOUSING ASSEMBLY

(71) Applicant: SAMSUNG ELECTRONICS CO., LTD., Suwon-si, Gyeonggi-Do (KR)

(72) Inventors: Jung-Hyun Woo, Hwaseong-si (KR); Jae-Hong Park, Gumi-si (KR); Han-Hong Lee, Suwon-si (KR); Sung-Woo Joo, Suwon-si (JP); Chang-Hoon Han, Cheonan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/396,946

(22) Filed: Jan. 3, 2017

(65) Prior Publication Data

US 2017/0308132 A1     Oct. 26, 2017

(30) Foreign Application Priority Data

Apr. 20, 2016   (KR) .................. 10-2016-0047954

(51) Int. Cl.
| | |
|---|---|
| *G06F 1/18* | (2006.01) |
| *H05K 5/02* | (2006.01) |
| *G11C 5/00* | (2006.01) |
| *G06F 1/16* | (2006.01) |

(52) U.S. Cl.
CPC .............. *G06F 1/18* (2013.01); *G06F 1/1658* (2013.01); *G06F 1/187* (2013.01); *G11C 5/005* (2013.01); *H05K 5/0269* (2013.01); *H05K 5/0282* (2013.01)

(58) Field of Classification Search
CPC ............ G06F 1/187; H05K 2201/2018; H05K 5/0269; H05K 5/0282
See application file for complete search history.

(56) References Cited

U.S. PATENT DOCUMENTS

| | | | | |
|---|---|---|---|---|
| 5,353,201 A | * | 10/1994 | Maeda ............... | H05K 9/0033 174/362 |
| 5,413,490 A | * | 5/1995 | Tan ................... | G06K 19/077 439/76.1 |
| 5,476,387 A | * | 12/1995 | Ramey ............... | G06K 19/077 235/492 |
| 5,526,233 A | * | 6/1996 | Hayakawa ........... | G06K 19/077 235/488 |
| 7,517,231 B2 | | 4/2009 | Hiew et al. | |
| 7,517,252 B2 | | 4/2009 | Ni et al. | |

(Continued)

FOREIGN PATENT DOCUMENTS

WO    WO 2014/146808 A1    9/2014

*Primary Examiner* — Adrian S Wilson
(74) *Attorney, Agent, or Firm* — Volentine, Whitt & Francos, PLLC

(57) ABSTRACT

A solid state drive (SSD) housing assembly includes an SSD housing and an extension frame. The SSD housing includes a first extension joint and a first mounting joint. The first mounting joint is a mechanism by which the housing can be mounted to an external device. The SSD housing has the form of a rectangular case in which an SSD module is held. The extension frame includes a second extension joint and a second mounting joint. The second mounting joint is a mechanism by which the frame can be mounted to the external device. The extension frame is attachable to and detachable from the SSD housing by virtue of the first extension joint and the second extension joint.

20 Claims, 29 Drawing Sheets

(56) References Cited

U.S. PATENT DOCUMENTS

| | | | |
|---|---|---|---|
| 7,559,469 B2 | 7/2009 | Noda et al. | |
| 7,649,743 B2 | 1/2010 | Ni et al. | |
| 7,869,218 B2 | 1/2011 | Ni et al. | |
| 8,014,143 B2* | 9/2011 | Chang | H01R 13/5213 361/679.31 |
| 8,213,182 B2* | 7/2012 | Aoki | H05K 5/0269 361/737 |
| 8,305,770 B2* | 11/2012 | Gunderson | H05K 7/1418 361/679.01 |
| 8,351,197 B2* | 1/2013 | Lo | G11B 33/124 361/679.33 |
| 8,665,601 B1 | 3/2014 | Mangay-Ayam, Jr. et al. | |
| 8,953,281 B1* | 2/2015 | Lee | G06F 1/187 360/99.15 |
| D754,131 S * | 4/2016 | Shim | D14/435 |
| 2002/0044416 A1* | 4/2002 | Harmon, III | G11B 33/08 361/679.36 |
| 2003/0017372 A1* | 1/2003 | Probst | A61N 1/375 429/7 |
| 2003/0082441 A1* | 5/2003 | Hovi | H01M 2/1061 429/123 |
| 2004/0233645 A1* | 11/2004 | Chen | G06F 1/1632 361/737 |
| 2005/0164532 A1* | 7/2005 | Ni | G06K 19/07732 439/79 |
| 2007/0133121 A1* | 6/2007 | Xu | G11B 33/08 360/97.19 |
| 2007/0173077 A1* | 7/2007 | Wang | H01R 13/6658 439/1 |
| 2007/0293079 A1* | 12/2007 | Chao | H01R 13/6275 439/352 |
| 2008/0089020 A1* | 4/2008 | Hiew | H05K 9/0067 361/679.31 |
| 2008/0158808 A1* | 7/2008 | Camarena | G06F 1/187 361/679.34 |
| 2008/0280490 A1* | 11/2008 | Nguyen | G06F 12/1416 439/607.01 |
| 2009/0167124 A1* | 7/2009 | Lee | G06F 1/187 312/223.2 |
| 2010/0053859 A1* | 3/2010 | Chang | H01R 13/5213 361/679.01 |
| 2010/0315774 A1* | 12/2010 | Walker | G06F 1/185 361/679.58 |
| 2014/0104779 A1 | 4/2014 | Yang et al. | |
| 2014/0111069 A1 | 4/2014 | Chen et al. | |
| 2014/0111933 A1 | 4/2014 | Knopf et al. | |
| 2015/0092337 A1* | 4/2015 | Tan | H05K 5/0008 361/679.31 |
| 2015/0146364 A1 | 5/2015 | Chou et al. | |
| 2017/0293585 A1* | 10/2017 | Lee | G06F 13/4068 |

* cited by examiner

SOLID STATE DRIVE (SSD) HOUSING AND SSD HOUSING ASSEMBLY

PRIORITY STATEMENT

This U.S. Non-provisional application claims priority under 35 USC § 119 to Korean Patent Application No. 10-2016-0047954, filed on Apr. 20, 2016, in the Korean Intellectual Property Office (KIPO), the disclosure of which is hereby incorporated by reference in its entirety.

BACKGROUND

1. Technical Field

The inventive concept relates generally to solid state drives (SSDs), and more particularly to the housing of a solid state drive (SSD).

2. Description of the Related Art

A solid state drive or solid state disk (SSD) is a storage device for storing data using memory such as flash memory. SSDs have widely replace hard disk drives (HDDs). An SSD has no mechanically-moving parts in comparison with an HDD, and thus an SSD may operate at a higher speed than an HDD because it offers shorter seek time, latency, mechanical driving time, etc. Also an SSD creates fewer operating errors than an HDD because it is free from the operating errors of an HDD created due to mechanical friction between moving parts of an HDD.

In general, an SSD is provided in the form of an SSD module that is mounted on a printed circuit board and the SSD is built in a closed-type housing or an open-type housing. The closed-type housing has a disadvantage of high cost and the open-type housing is vulnerable to electromagnetic interference (EMI).

SUMMARY

According to examples according to the inventive concept, an SSD housing assembly includes an SSD housing and an extension frame. The SSD housing includes a first extension joint and a first mounting joint, the first mounting joint to be combined with an external device. The SSD housing has a shape of a rectangular case in which an SSD module is held. The extension frame includes a second extension joint and a second mounting joint, the second mounting joint to be combined with the external device. The extension frame is attached to and detached from the SSD housing by combining and separating the first extension joint and the second extension joint.

According to examples according to the inventive concept, an SSD device includes an SSD module including a memory device and a connector for communication between the memory and an external device, an SSD housing including a first extension joint and a first mounting joint, the first mounting joint to be combined with the external device, the SSD housing having a shape of a rectangular case in which the SSD module is held and an extension frame including a second extension joint and a second mounting joint, the second mounting joint to be combined with the external device, the extension frame being attached to and detached from the SSD housing by combining and separating the first extension joint and the second extension joint.

According to examples according to the inventive concept, an SSD housing includes a first mounting joint to be combined with an external device and an extension joint to be combined with an extension frame, the extension frame including a second mounting portion to be combined with the external device. The SSD housing has a shape of a rectangular case in which an SSD module is held.

The SSD housing assembly according to examples according to the inventive concept may provide an SSD housing suitable for a small-sized SSD and may be used for various systems with low cost and high efficiency by varying outside dimensions of the housing using the extension frame.

BRIEF DESCRIPTION OF THE DRAWINGS

The inventive concept will be more clearly understood from the following detailed description of examples taken in conjunction with the accompanying drawings.

DETAILED DESCRIPTION

Figure 1:
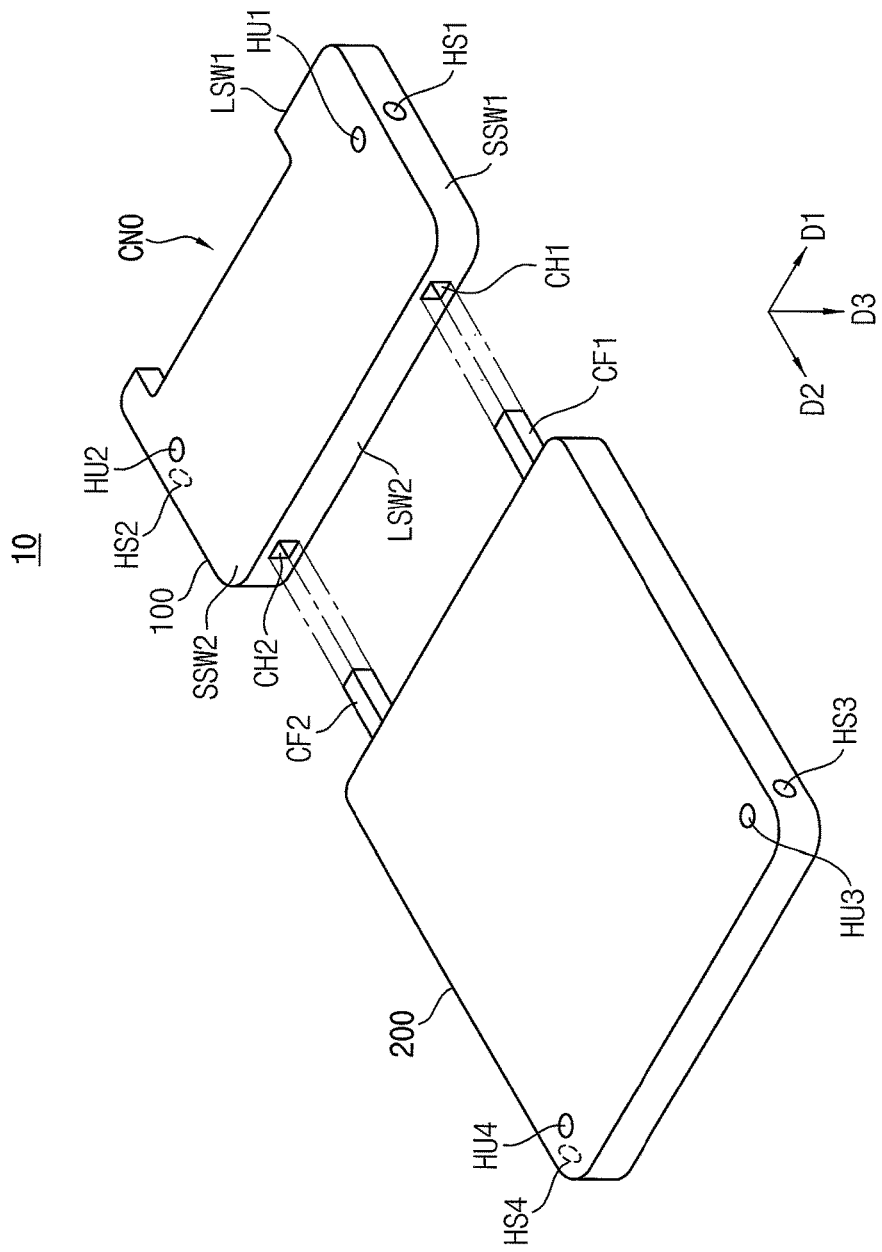
FIG. 1 is a perspective view illustrating an example of a solid state drive (SSD) housing assembly according to the inventive concept in a separated or disassembled state.

The inventive concept will be described more fully hereinafter with reference to the accompanying drawings, in which some examples according to the inventive concept are shown. In the drawings, like numerals designate like elements throughout. Descriptions of elements, features, characteristics, etc. of an example may be omitted from the description of another example(s) possessing the same elements, features or characteristics.

Figure 2:
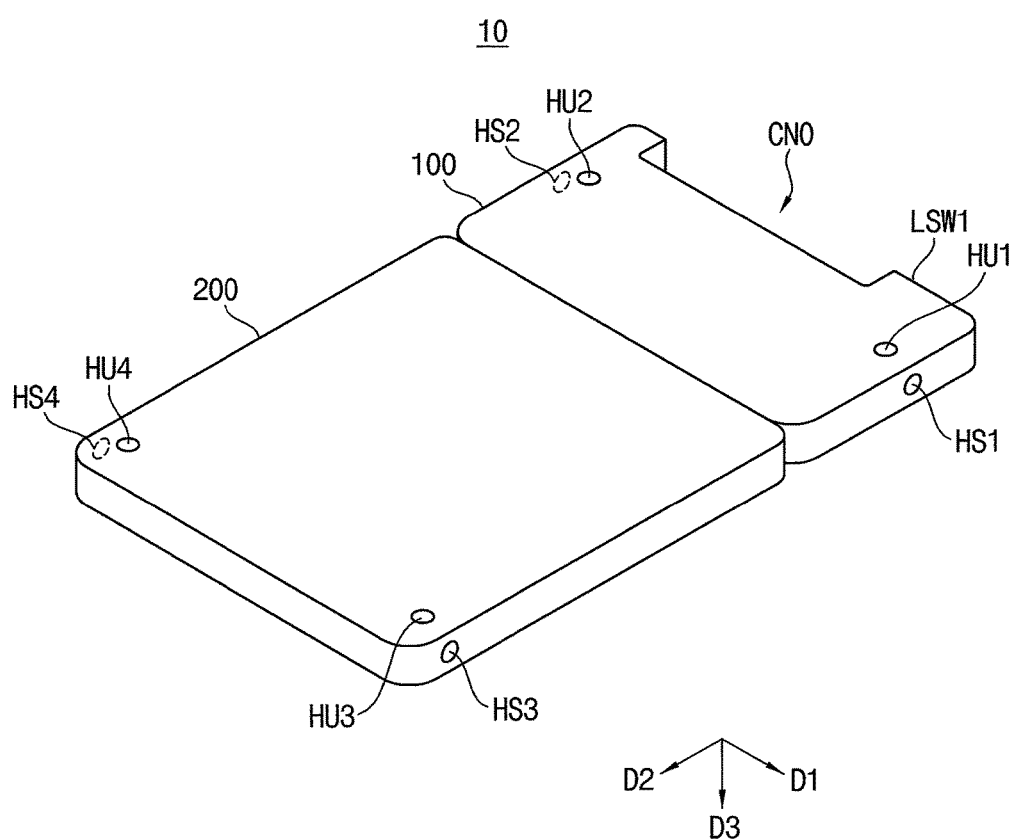
FIG. 2 is a perspective view illustrating the SSD housing assembly of FIG. 1 in an assembled state.

FIG. 1 is a perspective view illustrating a disassembled state of a solid state drive (SSD) housing assembly according to the inventive concept, and FIG. 2 is a perspective view illustrating the SSD housing assembly of FIG. 1 in its assembled state.

Referring to FIGS. 1 and 2, an SSD housing assembly 10 includes an SSD housing 100 and an extension frame 200.

The SSD housing 100 includes a first extension joint CH1 and CH2 (which may be referred to as a first extension joint "part"), and a first mounting joint HU1, HU2, HS1 and HS2 (which may be referred to as a first mounting joint "part") to be combined with an external device. The SSD housing 100 has a shape of a rectangular case in which an SSD module is held as will be described below with reference to FIGS. 4 through 7. Here, as in the description that follows, the shape of elements will generally be referring to the shape as viewed in plan. Thus, a component that has substantial dimensions in all three dimensions (length, width and thickness) and is merely described as rectangular will have the form of a rectangular cuboid.

The extension frame 200 includes a second extension joint CF1 and CF2 (which may be referred to as a second extension joint "part"), and a second mounting joint HU3, HU4, HS3 and HS4 (which may be referred to as a second mounting joint "part") to be combined with the external device. The extension frame 200 may be attached to and detached from the SSD housing 100 by combining and separating the first extension joint CH1 and CH2 and the second extension joint CF1 and CF2. That is, the first extension joint CH1 and CH2 and the second extension joint CF1 and CF2 together form a connector of the housing assembly 10.

In some examples according to the inventive concept, the first mounting joint HU1, HU2, HS1 and HS2 and the second mounting joint HU3, HU4, HS3 and HS4 may be mounting holes to be combined with the external device. The mounting holes may include upper mounting holes HU1, HU2, HU3 and HU4 that are formed at the upper surfaces of the SSD housing 100 and the extension frame 200 and side mounting holes HS1, HS2, HS3 and HS4 that are formed at side walls of the SSD housing 100 and extension frame 200. In some examples according to the inventive concept, the mounting holes HU1, HU2, HU3, HU4, HS1, HS2, HS3 and HS4 may be screw (tapped) holes, i.e., threads to be combined with screws may be formed at inner surfaces of the mounting holes HU1, HU2, HU3, HU4, HS1, HS2, HS3 and HS4.

For convenience of illustration, the first extension joint CH1 and CH2 is illustrated as holes and the second extension joint CF1 and CF2 is illustrated as protrusions in FIG. 1, but other forms of connectors provided by the first extension joint CH1 and CH2 and the second extension joint CF1 and CF2 may be provided. In some examples according to the inventive concept, the first extension joint CH1 and CH2 and the second extension joint CF1 and CF2 may constitute a threaded connector, i.e., a connector comprising screws and threaded openings. In other examples according to the inventive concept, the first extension joint CH1 and CH2 and the second extension joint CF1 and CF2 may constitute a connector comprising hooks, i.e., a snap fit in which hooks are deflected when inserted into holes and then snap back to hook the housing 100, for example, provided with the holes.

As illustrated in FIG. 1, the SSD housing 100 has first and second long side walls LSW1 and LSW2 that are parallel in a first direction D1 and opposite to each other and first and second short side walls SSW1 and SSW2 that are parallel in a second direction D2 perpendicular to the first direction D1 and opposite to each other. The upper surface and the bottom surface of the SSD housing 100 are opposite to each other in a third direction D3 perpendicular to the first and second directions D1 and D2. A connector opening CNO is formed at the first long side wall LSW1 such that a connector of the SSD module may be exposed through the connector opening CNO. The first extension joint CH1 and CH2 is formed at the second long side wall LSW2.

The extension frame 200 is illustrated as a rectangular case in FIG. 1 for convenience of illustration, but the extension frame 200 may have other forms and/or shapes. In particular, the extension frame 200 may include a plurality of frame segments where each frame segment has a shape of a rod.

According to an aspect of the examples of the inventive concept described above, the SSD housing assembly 10 may include an SSD housing 100 suitable for a small SSDs and may be used for various systems with low cost and high efficiency by allowing the outer dimensions of the assembly to be varied by selective use of the extension frame 200.

Figure 3:
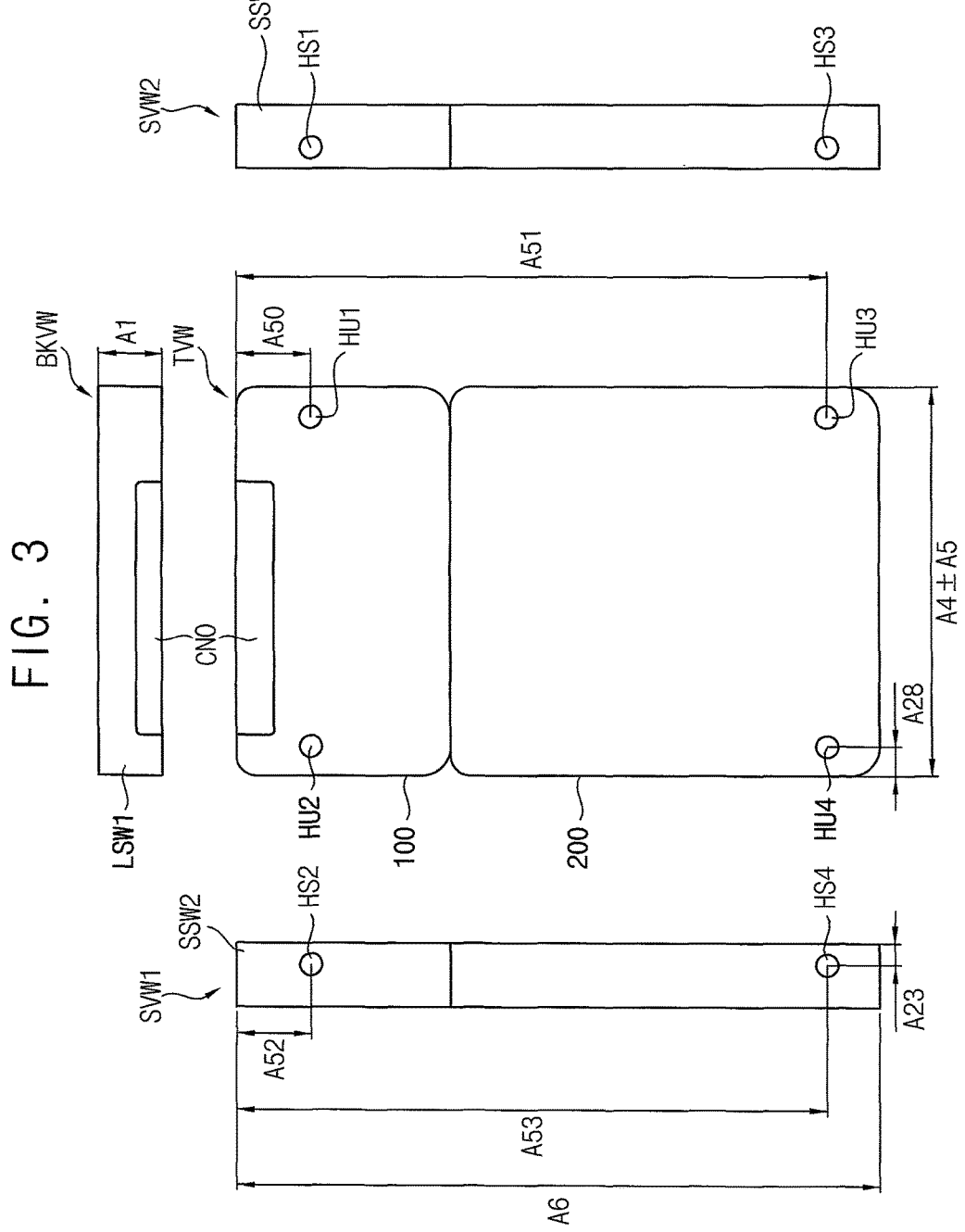
FIG. 3 is a development view of the SSD housing assembly of FIG. 2.

FIG. 3 is a development view of the SSD housing assembly of FIG. 2. FIG. 3 illustrates a top view TVW, side views SVW1 and SVW2 and a back view BKVW of the SSD housing assembly 10 in the combined state. The dimensions A1, A4, A5 and A6 regarding the physical size of the SSD housing assembly 10 and the dimensions A23, A28, A51, A52, A53 and A54 regarding the locations of the first mounting joint HU1, HU2, HS1 and HS2 and the second mounting joint HU3, HU4, HS3 and HS4 are illustrated in FIG. 3.

FIG. 3 shows the case of the SSD housing 100 substantially in the form of a rectangular cuboid and wherein the housing 100 has top and bottom planar surfaces parallel to one another, planar side surfaces parallel to one another, a front and a back. Likewise, the extension frame 200 is shown as having top and bottom surfaces coplanar with the top and bottom surfaces of the housing, respectively, side surfaces coplanar with the side surfaces of the housing, respectively, a front and a back. Also, the SSD assembly has a joint (constituted by the aforementioned extension joints CH1, CH2 and CF1, CF2) located between the back of the of the housing 100 and the front of the of the extension frame 200 and by which the extension frame is detachably connected to the housing 100. The coplanar top surfaces of the housing 100 and the extension frame 200, as shown in the plan view of FIG. 3, collectively inscribe a polygon that is substantially rectangular. Likewise, the coplanar bottom surfaces of the housing and the extension frame collectively inscribe a polygon that is substantially rectangular. Here, the term "substantially rectangular" is used to indicate that the shape may be rectangular or rectangular except for rounded corners.

In some examples according to the inventive concept, when the SSD housing 100 and the extension frame 200 are combined, the dimensions A1, A4, A5, A6, A23, A28, A51, A52, A53 and A54 of the SSD housing assembly 10 may satisfy small form factor (SFF) standards for dimensions of disk drives. The dimensions of major surfaces of the assembly, such as A6 and A4±A5 refer to maximum dimensions in a particular direction within an allowable tolerance.

In some examples according to the inventive concept, the first mounting joint HU1, HU2, HS1 and HS2 and the second mounting joint HU3, HU4, HS3 and HS4 may be mounting holes to be combined with the external device. In this case, when the SSD housing 100 and the extension frame 200 are combined, the dimensions A23, A28, A51, A52, A53 and A54 regarding positions of the mounting holes HU1, HU2, HU3, HU4, HS1, HS2, HS3, HS4 may satisfy the SFF standards.

For example, the dimensions A1, A4, A5, A6, A23, A28, A51, A52, A53 and A54 of the SSD housing assembly 10 may satisfy SFF-8201 standards for defining dimensions of 2.5 inch disk drives. For example, the connector opening CNO may satisfy SFF-8223 for defining dimensions of locations of a serial connector of the 2.5 inch disk drives.

Figure 4:
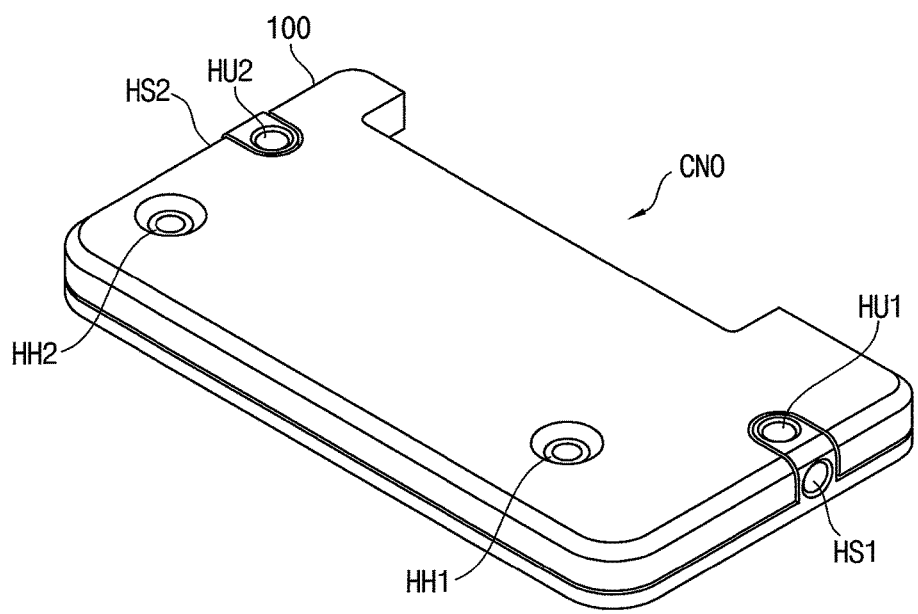
FIG. 4 is a perspective view of an example of a small-sized SSD housing.

FIG. 4 is a perspective view of a small-sized SSD housing for comparison.

Referring to FIG. 4, an SSD housing 100 includes a mounting joint HU1, HU2, HS1 and HS2 and has a shape of a rectangular case for holding an SSD module therein. The mounting joint HU1, HU2, HS1 and HS2 corresponds to the above-mentioned first mounting joint. As will be described below, the SSD housing 100 may be a closed-type housing such that an SSD module may be held in the internal space of the SSD housing 100 that are formed by combining a bottom plate and a top cover. The SSD housing 100 may further include a housing joint HH1 and HH2 for combining the bottom plate and the top cover.

Figure 8:
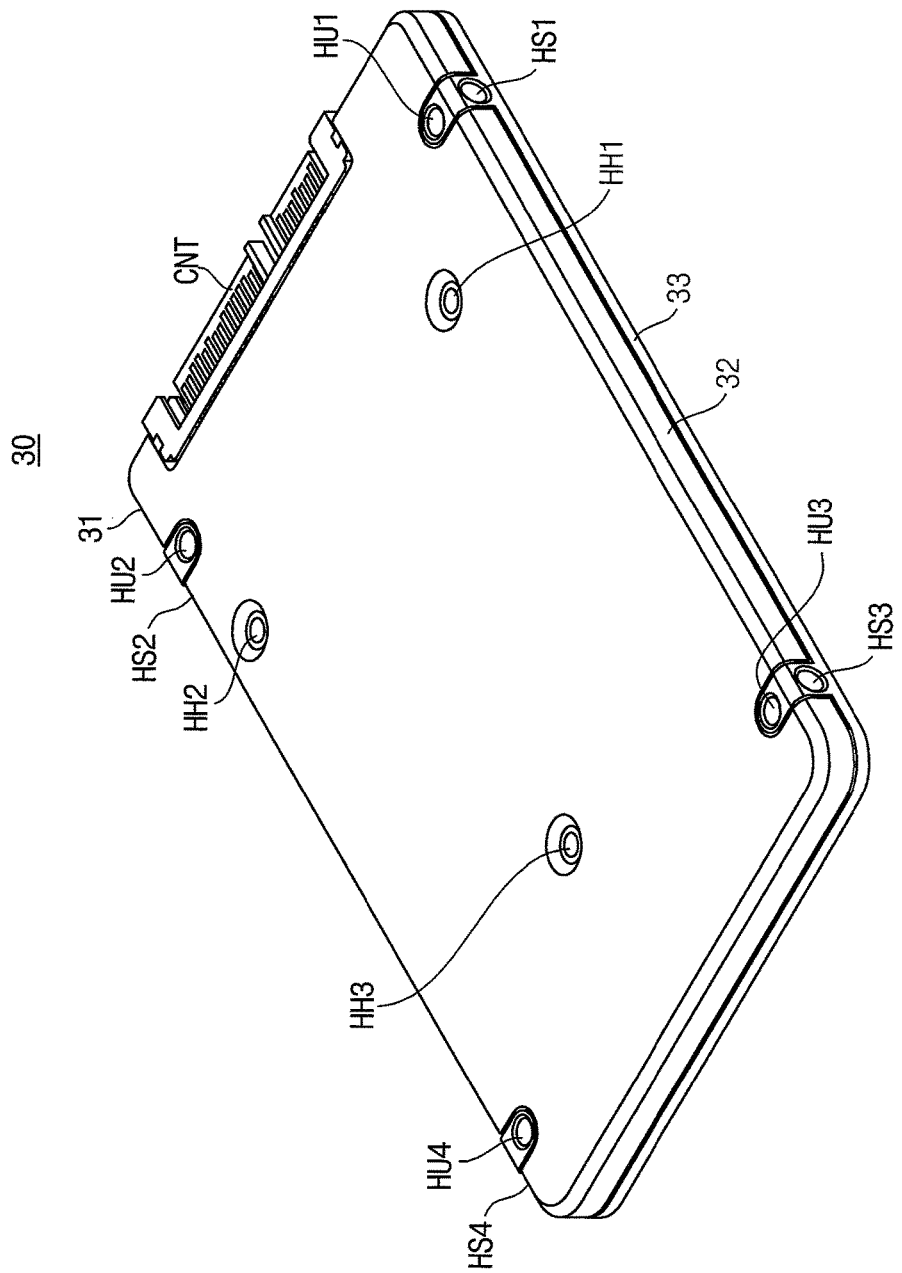
FIG. 8 is a perspective view of a full-sized SSD device.

The length of the side wall, at which the connector opening CNO is formed, of the small-sized SSD housing 100 of FIG. 4 may be equal to the length of the corresponding side wall of the full-sized SSD housing 31 of FIG. 8. However, the other side wall of the small-sized SSD housing 100 of FIG. 4 may be significantly shorter than the corresponding side wall of the full-sized SSD housing 31 of FIG. 8. In comparison with the full-sized SSD housing 31, the small-sized and light SSD housing 100 has enhanced electromagnetic interference (EMI) characteristics and enhanced mechanical reliance because it is more robust so as to better withstand external impacts.

Figure 5:
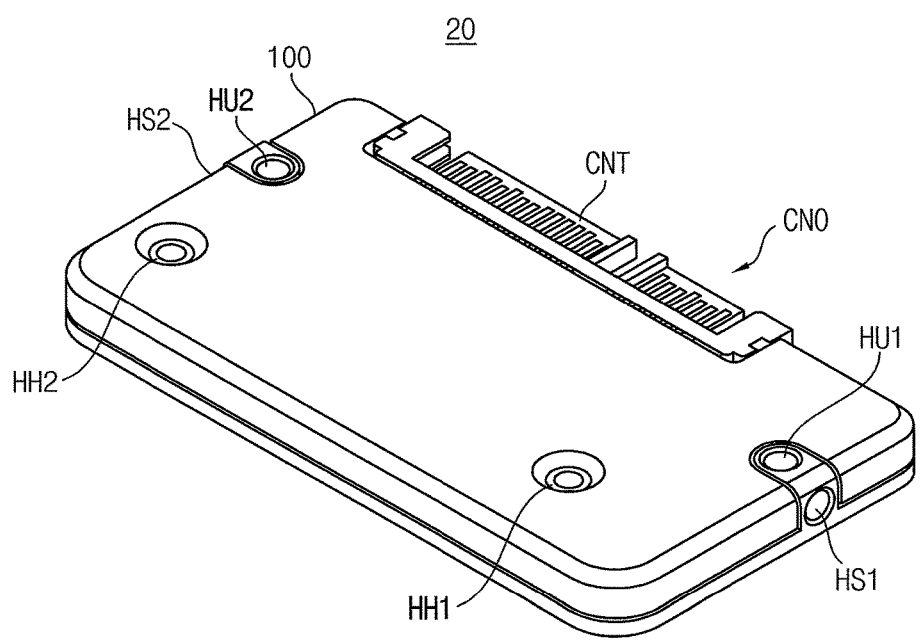
FIG. 5 is a perspective view of an SSD device having the small-sized housing of FIG. 4.
Figure 6:
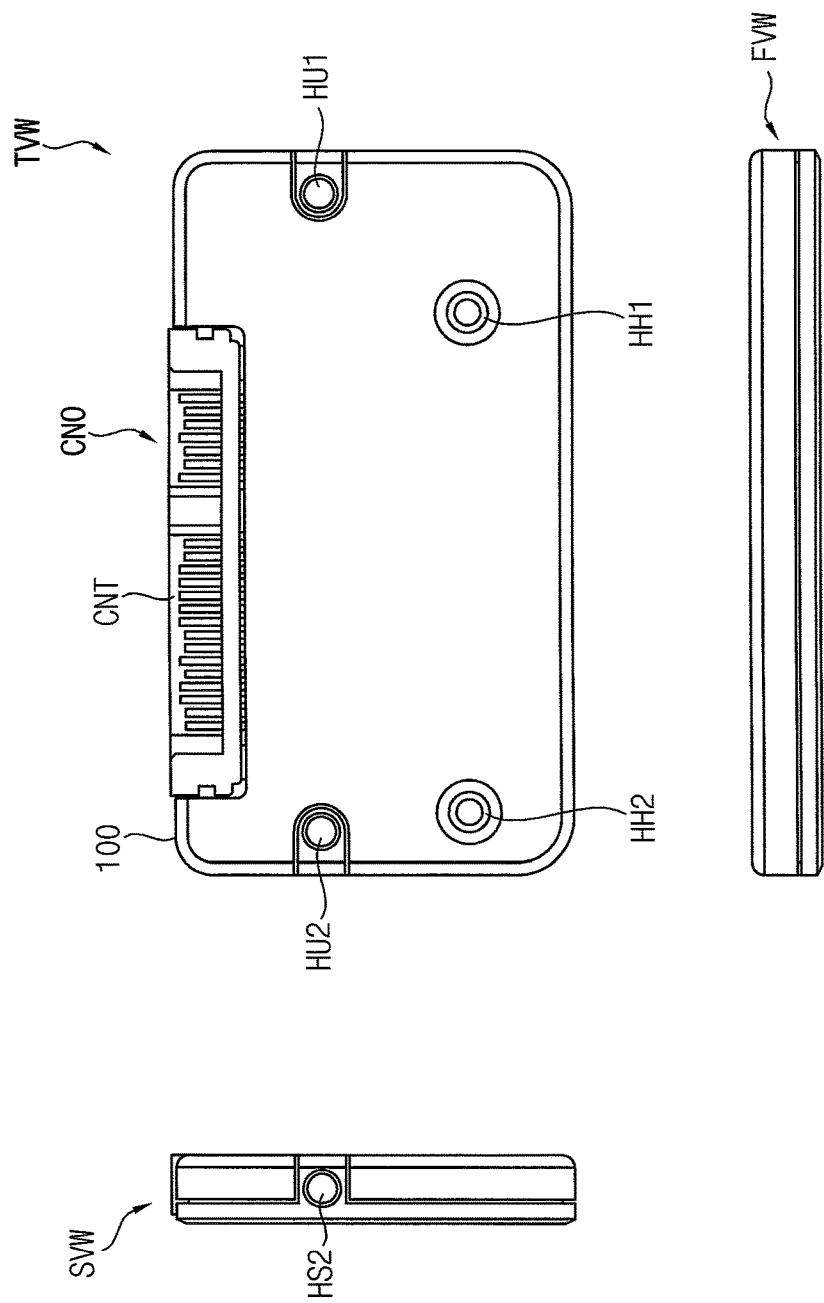
FIG. 6 is a development view of the SSD device of FIG. 5.
Figure 7:
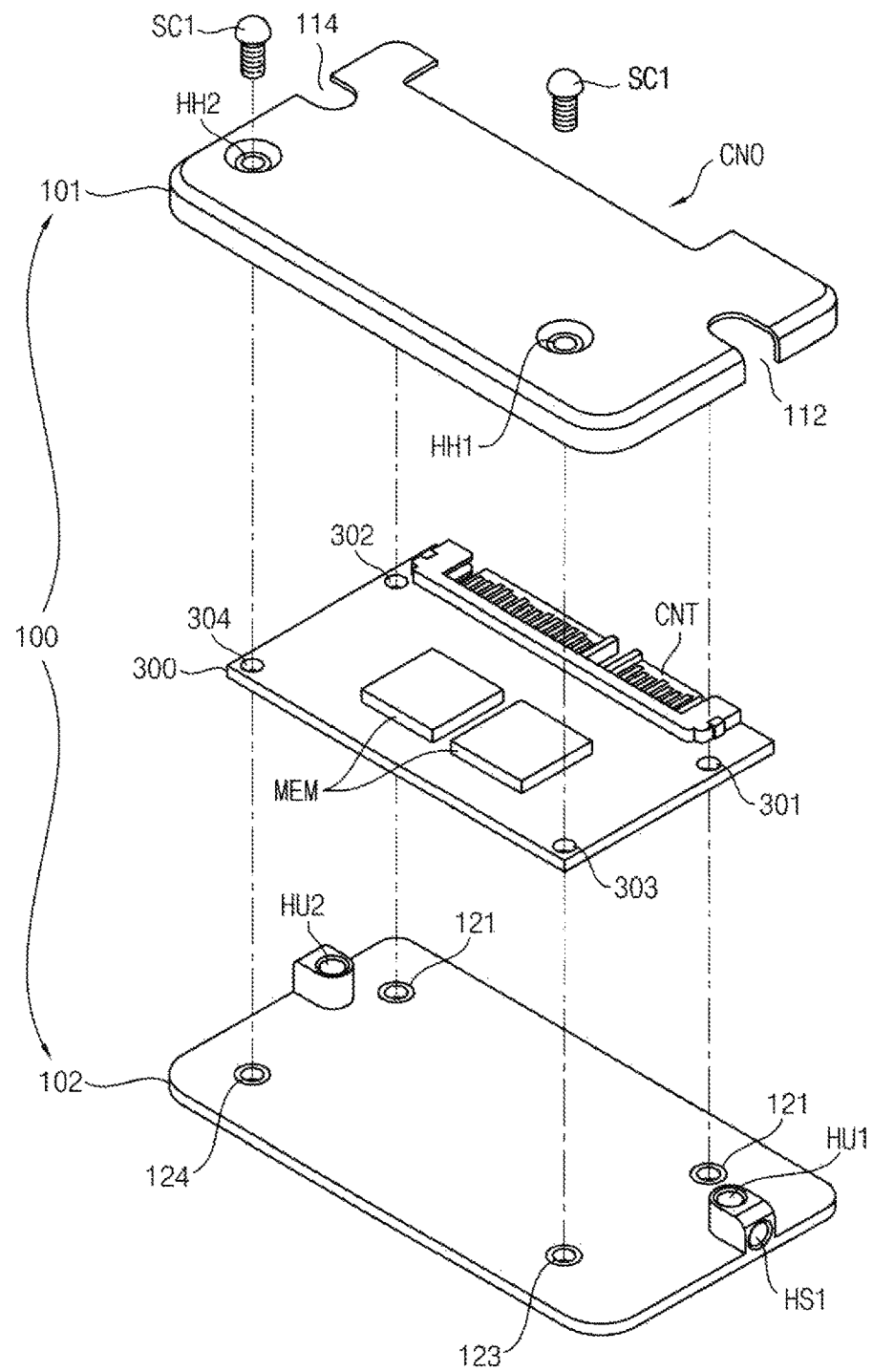
FIG. 7 is an exploded perspective view of the SSD device of FIG. 5.

FIG. 5 is a perspective view illustrating an SSD device having the housing of FIG. 4, FIG. 6 is a development view of the SSD device of FIG. 5, and FIG. 7 is an exploded perspective view of the SSD device of FIG. 5. FIG. 6 illustrates a top view TVW, a front view FVW and a side view SVW of the SSD housing 100 of FIG. 5.

Referring to FIGS. 5, 6 and 7, an SSD device 20 includes an SSD housing 100 and an SSD module 300 that is held in the SSD housing 100. The SSD housing 100 includes a top cover 101 and a bottom plate 102.

A bottom housing joint 121, 122, 123 and 124 to be combined with the top cover 101 and screw housing at which the first mounting joint HU1, HU2, HS1 and HS2, that is, the mounting holes may be formed on a top surface of the bottom plate 102. A top housing joint HH1 and HH2 and indented portions (recesses) 112 and 114 to be combined with the bottom plate 102 and may be formed at the top cover 101. The SSD module 300 may include a substrate and other components such as memory chips that are integrated or mounted on the substrate. Other components of the SSD module 300 are omitted but memory chips MEM mounted on the substrate and a connector CNT attached to one side of the substrate are illustrated in FIG. 7. The SSD module 300 includes a substrate housing joint 301, 302, 303 and 304 to be fixed and held in the SSD housing 100.

For example, the top housing joint HH1 and HH2, the corresponding substrate housing joint 303 and 304 and the corresponding bottom housing joint 123 and 124 may be combined using screws SC1 and SC2. In this case, the top housing joint HH1 and HH2 and the corresponding substrate housing joint 303 and 304 may be formed as apertures and the corresponding bottom housing joint 123 and 124 may be formed as screw holes. The other portions of the top housing joint may be formed as protrusions (not shown) on a bottom surface of the top cover 101, the corresponding substrate housing joint 301 and 302 may be formed as apertures, and the corresponding bottom housing joint 121 and 122 may be formed as holes to be combined with, i.e., to receive, the protrusions.

The connector CNT may be exposed through the connector opening CNO that is formed when the top cover 101 and the bottom plate 102 are combined. The connector opening CNO may be closed off by the exposed connector CNT when the SSD housing 100 and the SSD module 300 are combined.

Figure 9:
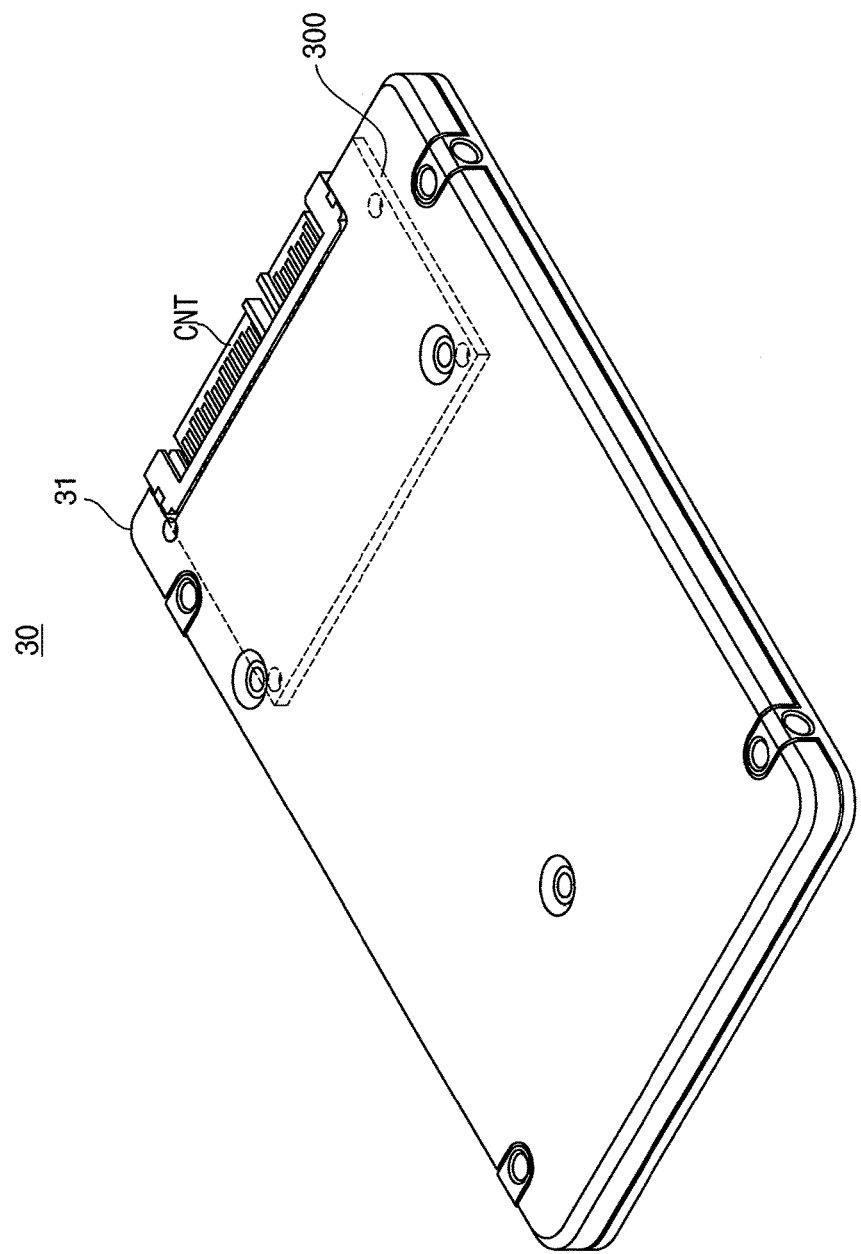
FIG. 9 is a perspective view of the full-sized SSD device of FIG. 8 but illustrating an internal space of the device.

FIG. 8 is a perspective view illustrating a full-sized SSD device, and FIG. 9 is a perspective view illustrating internal spaced of the full-sized SSD device of FIG. 8.

Referring to FIGS. 8 and 9, an SSD device 30 includes a full-sized SSD housing 31 and an SSD module 300 that is held in the full-sized SSD housing 31. The full-sized SSD housing 31 includes a top cover 32 and a bottom plate 33.

The full-sized SSD housing 31 includes a first mounting joint HU1, HU2, HS1 and HS2 and a second mounting joint HU3, HU4, HS3 and HS4 to be combined with an external device, and a housing joint HH1, HH2 and HH3 for combining the top cover 32 and the bottom plate 33.

The SSD module 300 held in the full-sized SSD housing 31 of FIG. 9 may have the same size as the SSD module 300 held in the small-sized SSD housing 100 of FIG. 5. The size of the substrate such as a printed circuit board (PCB) of the SSD module 300 is being decreased for cost reduction and so on, and thus a huge internal space of the full-sized SSD housing 31 remains empty so as to satisfy the SFF standards. The 2.5 inch housing and the 1.8 inch housing are specified by the international standards and thus it is impractical to alter the housing size arbitrarily. In case of a conventional frame housing, the SSD module substrate is exposed and is thus vulnerable to EMI and external impacts.

The small-sized SSD housing 100 according to the inventive concept may reduce cost and enhance reliability with respect to EMI and mechanical characteristics by shielding the module substrate. At the same time, the external size of the device may be adjusted using the extension frame 200 to satisfy the international standards. The small-sized SSD housing 100 may be applicable to some systems and the extension frame 200 may be used to change the external size of the housing when the small-sized SSD housing 100 is not attachable to a system configured to receive a large-sized SSD device.

Figure 10:
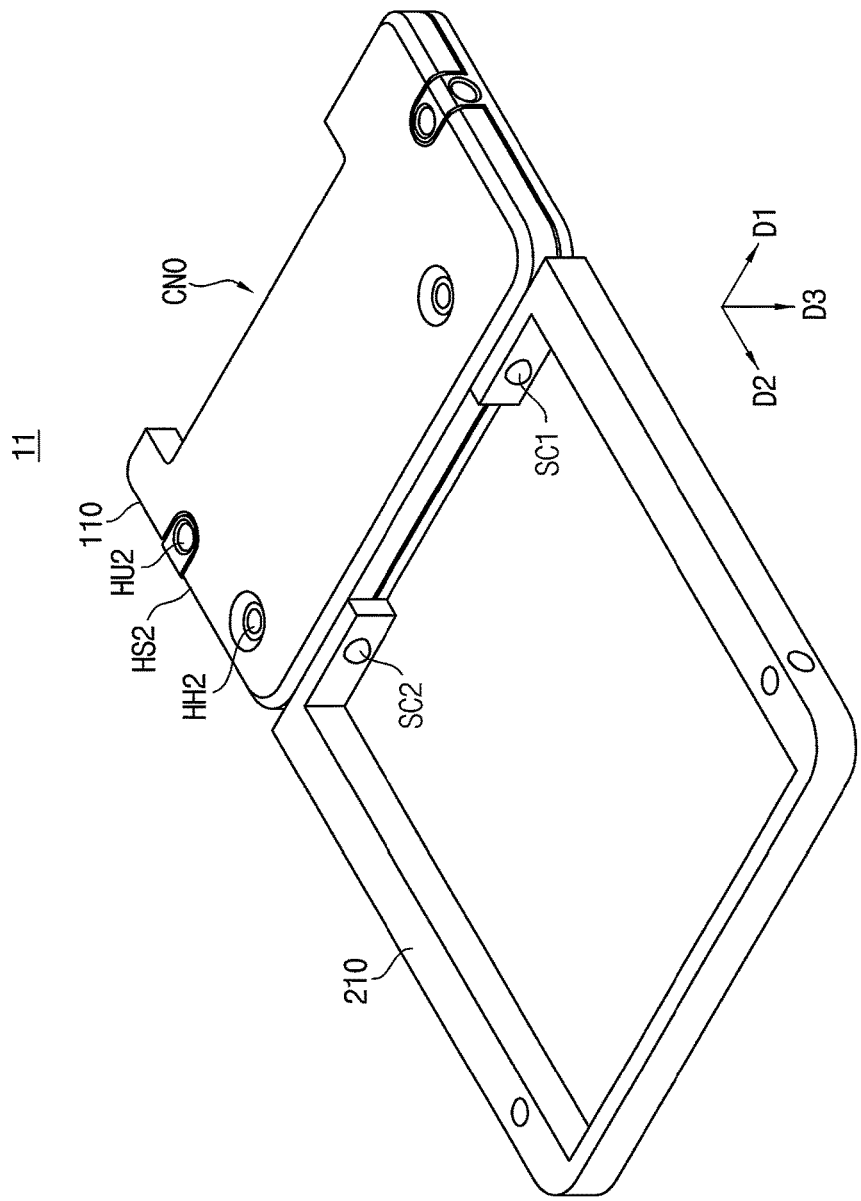
FIG. 10 is a perspective view illustrating an example of an SSD housing assembly according to the inventive concept.
Figure 11:
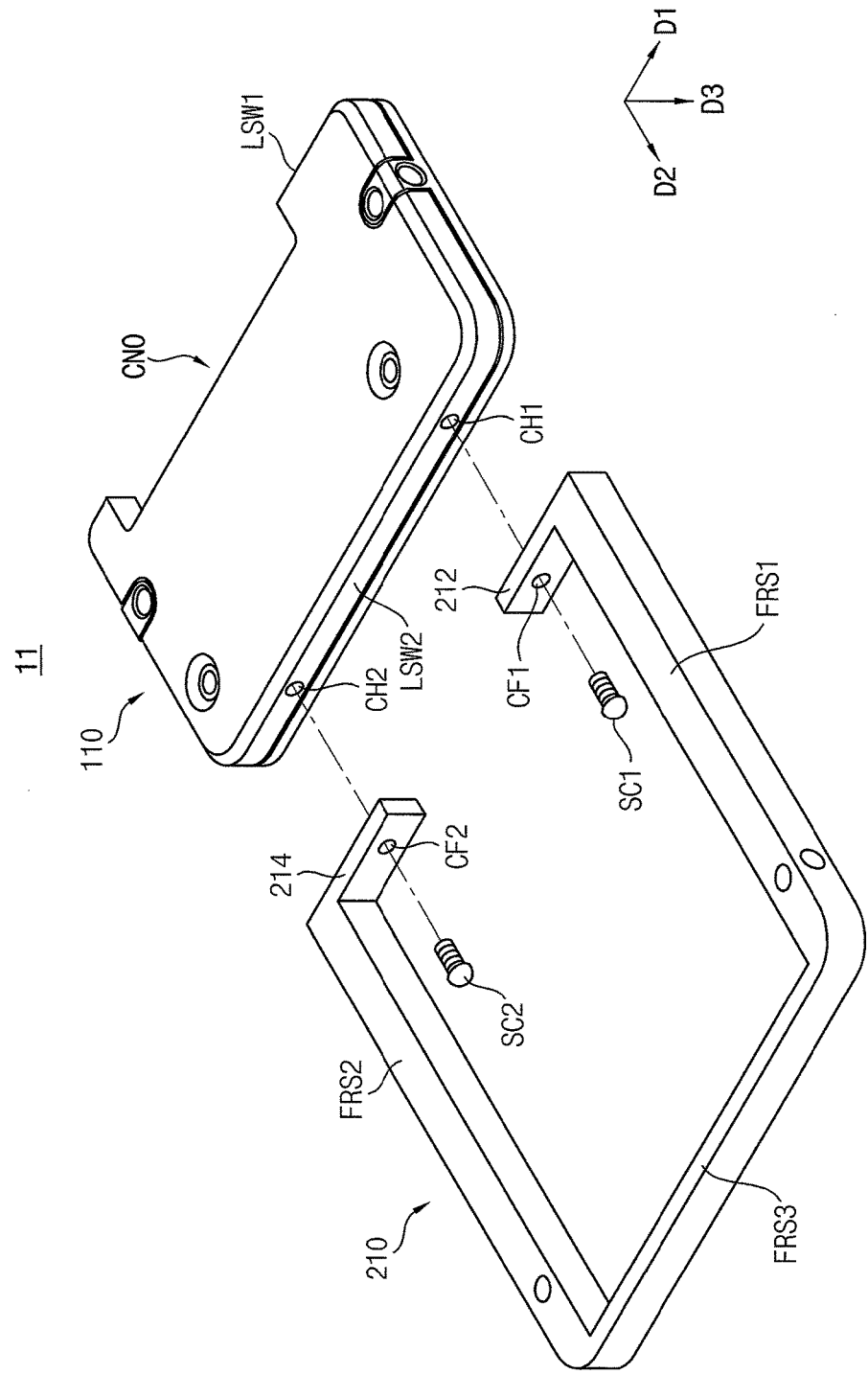
FIG. 11 is a perspective view of the SSD housing assembly of FIG. 10 but in a separated or disassembled state.
Figure 12:
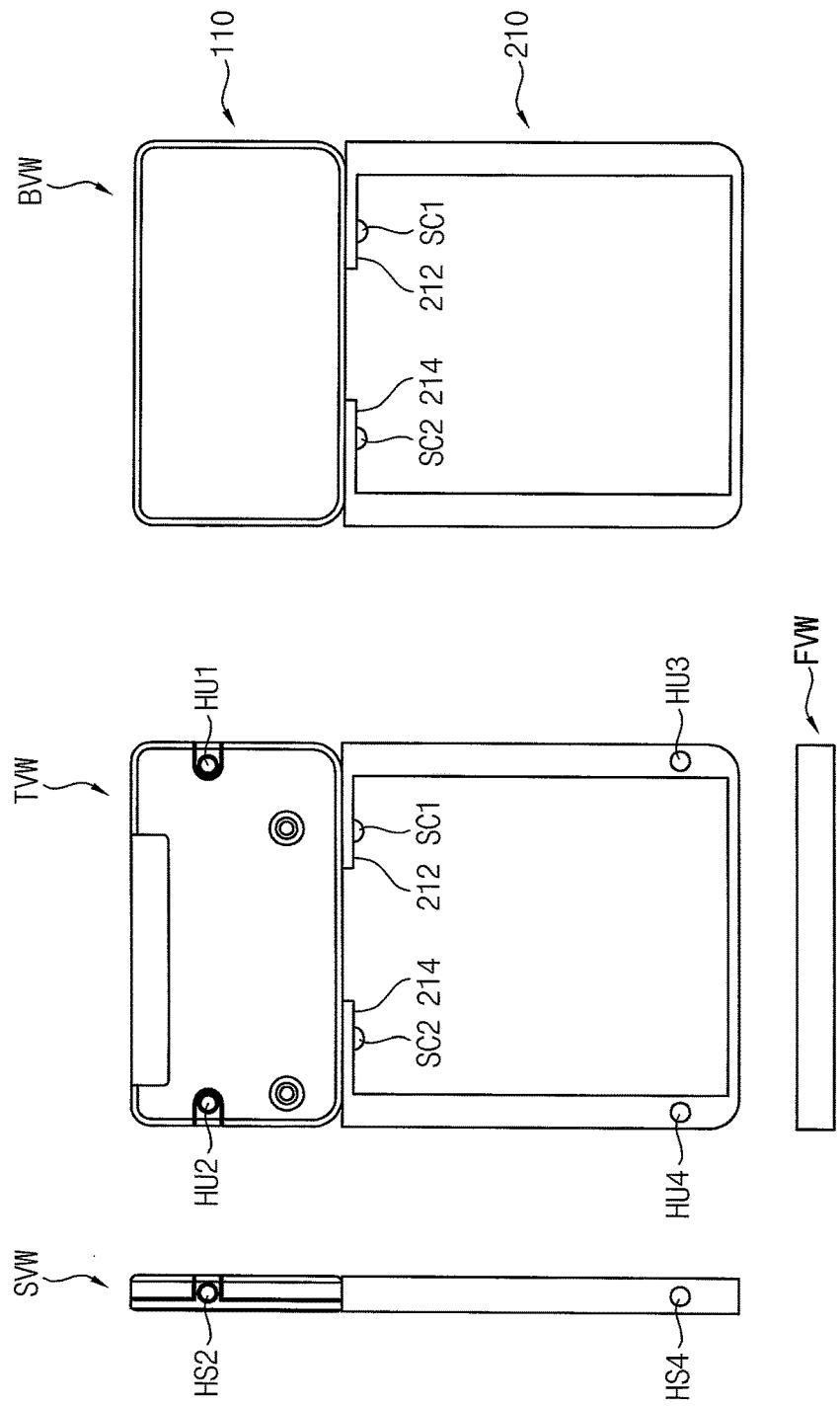
FIG. 12 is a development view of the SSD housing assembly of FIG. 10.

FIG. 10 is a perspective view illustrating an example of an SSD housing assembly according to the inventive concept, FIG. 11 is a perspective view illustrating a separated state of the SSD housing assembly of FIG. 10, and FIG. 12 is a development view of the SSD housing assembly of FIG. 10. FIG. 12 illustrates a top view TVW, a bottom view BVW, a side view SVW and a front view FVW of the SSD housing assembly 11 in the combined state of FIG. 10.

Referring to FIGS. 10, 11 and 12, the SSD housing assembly 11 includes an SSD housing 110 and an extension frame 210.

The SSD housing 110 includes a first extension joint CH1 and CH2 and an mounting joint HU1, HU2, HS1 and HS2 to be combined with an external device. The SSD housing 110 has a shape of a rectangular case in which an SSD module is held as described above. The extension frame 210 includes a second extension joint CF1 and CF2 and a second mounting joint HU3, HU4, HS3 and HS4 to be combined with the external device. The length of the SSD housing 110 along the first direction D1 is equal to the length of the extension frame 210 along the first direction D1. Accordingly, the SSD housing assembly may have a rectangular shape, i.e., the overall shape of the housing assembly when the SSD housing 110 and the extension frame 210 are combined is rectangular.

In some examples according to the inventive concept, the first mounting joint HU1, HU2, HS1 and HS2 and the second mounting joint HU3, HU4, HS3 and HS4 may be mounting holes to be combined with the external device. The mounting holes may include upper mounting holes HU1, HU2, HU3 and HU4 that are formed at the upper surfaces of the SSD housing 110 and the extension frame 210 and side mounting holes HS1, HS2, HS3 and HS4 that are formed at side walls of the SSD housing 110 and extension frame 210. In some examples according to the inventive concept, the mounting holes HU1, HU2, HU3, HU4, HS1, HS2, HS3 and HS4 may be screw holes and spirals to be combined with screws may be formed at inner surfaces of the mounting holes HU1, HU2, HU3, HU4, HS1, HS2, HS3 and HS4.

The SSD housing 110 has first and second long side walls LSW1 and LSW2 that are parallel in a first direction D1 and opposite to each other and first and second short side walls SSW1 and SSW2 that are parallel in a second direction D2 perpendicular to the first direction D1 and opposite to each other. The upper surface and the bottom surface of the SSD housing 100 are opposite to each other in a third direction D3 perpendicular to the first and second directions D1 and D2. A connector opening CNO is formed at the first long side wall LSW1 such that a connector of the SSD module may be exposed through the connector opening CNO. The first extension joint CH1 and CH2 is formed at the second long side wall LSW2.

The extension frame 210 may include a plurality of frame segments where each frame segment has a shape of a rod, i.e., each frame segment "extends" lengthwise or longitudinally in a particular direction. In an example according to the inventive concept, the extension frame 210 may include a first frame segment FRS1, a second frame segment FRS2 and a third frame segment FRS3. The first frame segment FRS1 extends in the second direction D2 and a proximal end portion of the first frame segment FRS is combined with the SSD housing 110 at a first end portion of the second long side wall LSW2 of the SSD housing 110. The second frame segment FRS2 extends in the second direction D2 and a proximal end portion of the second frame segment FRS2 is combined with the SSD housing 110 at a second end portion of the second long side wall LSW2 of the SSD housing 110. The third frame segment FRS3 extends in the first direction D1 to connect the first frame segment FRS1 and the second frame segment FRS2. The second mounting joint HU3, HU4, HS3 and HS4 is formed at distal end portions of the first and second frame segments FRS1 and FRS2 where the distal end portions of the first and second frame segments FRS1 and FRS2 are opposite to the proximal end portions of the first and second frame segments FRS1 and FRS2.

In some examples according to the inventive concept, as illustrated in FIG. 10, the third frame segment FR3 may connect the distal end portions of the first and second frame segments FRS1 and FRS2, where the distal end portions represent the end portions remote from the second long side wall LSW2 when the first and second frame segments FRS1 and FRS2 are combined with the SSD housing 110. In other examples according to the inventive concept, as will be described below with reference to FIGS. 22a through 22e, the third frame segment FR3 may connect the proximal end portions of the first and second frame segments FRS1 and FRS2, where the proximal end portions represent the end portions closest to the second long side wall LSW2 when the first and second frame segments FRS1 and FRS2 are combined with the SSD housing 110.

In some examples according to the inventive concept, the first frame segment FRS1, the second frame segment FRS1 and the third frame segment FRS3 may be formed unitarily as illustrated in FIGS. 10 and 11 by an injection molding process, for example. In other examples according to the inventive concept, the first frame segment FRS1, the second frame segment FRS1 and the third frame segment FRS3 may be formed as individual components as will be described below with reference to FIG. 25, and at least one of the frame segments FRS1, FRS2 and FRS3 may be attachable to and detachable from another of the frame segments FRS1, FRS2 and FRS3.

The second extension joint CF1 and CF2 of the extension frame 210 may be formed at contact parts 212 and 214 that extend in the first direction D1 from the proximal end portions of the first and second frame segments FRS1 and FRS2. In some examples according to the inventive concept, the second extension joint CF1 and CF2 may be formed as apertures through which screws SC1 and SC2 may penetrate the contact parts 212 and 214. The first extension joint CH1 and CH2 may be formed as screw holes at the second long side wall LSW2. The SSD housing 110 and the extension frame 210 may be combined by pressing the contact parts 212 and 214 to the second long side wall LSW2 and then securing them using the screws SC1 and SC2.

Figure 22A:
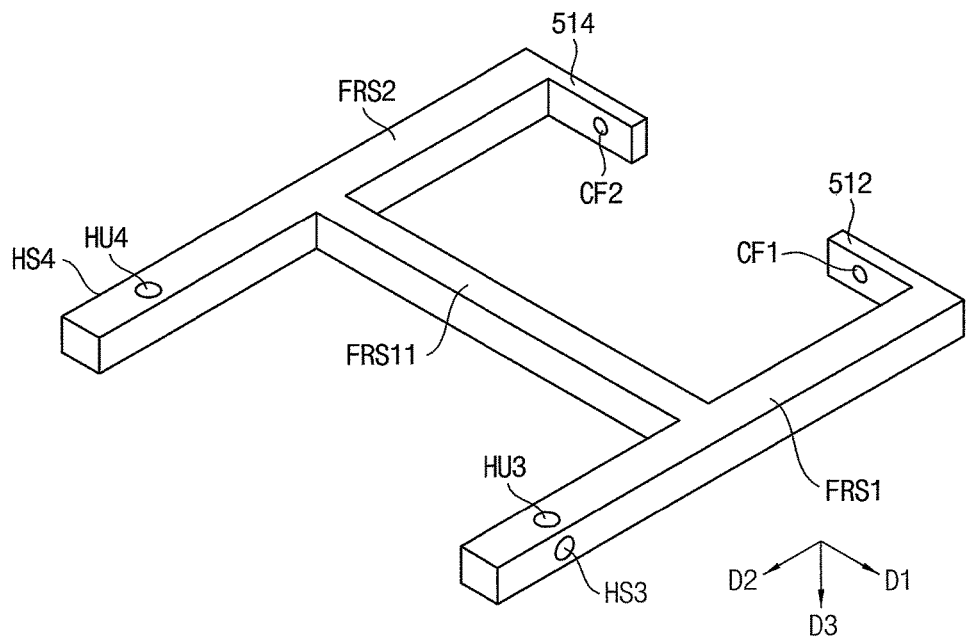
FIGS. 22A, 22B, 22C, 22D, 22E, 23 and 24 are perspective views of examples of extension frames according to the inventive concept.
Figure 22B:
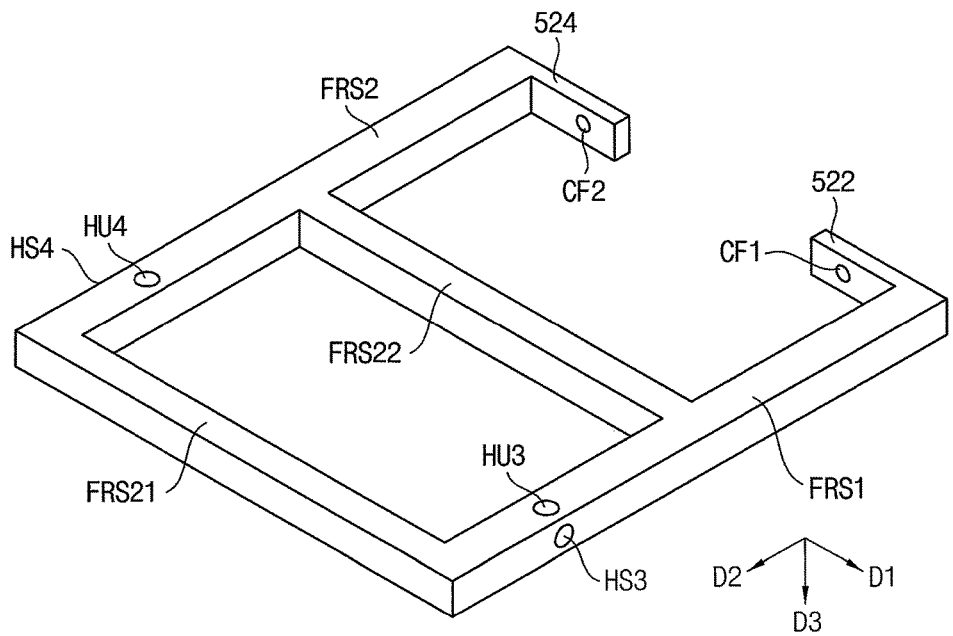
Figure 22C:
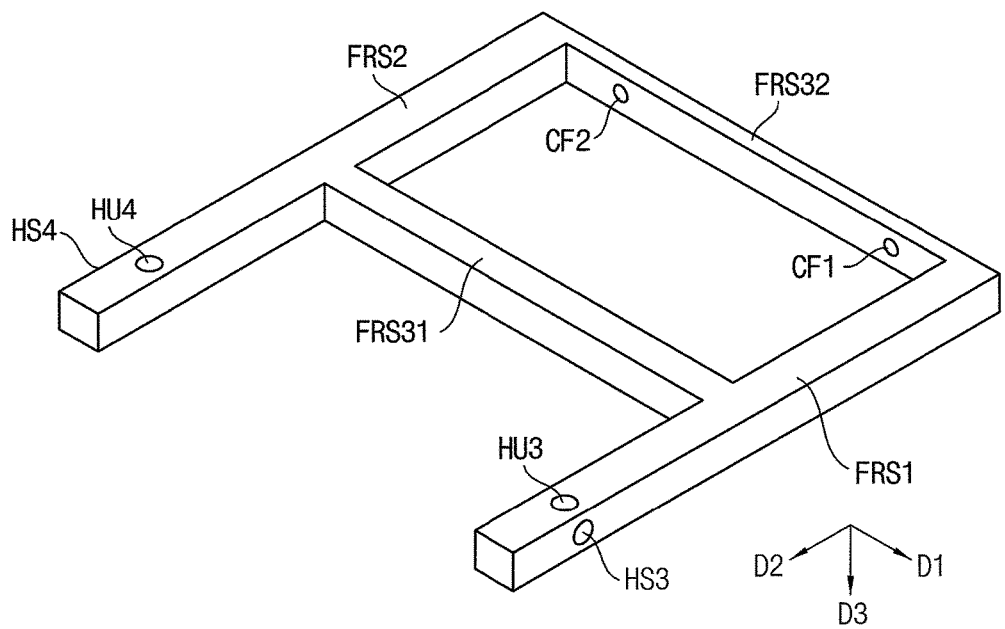
Figure 22D:
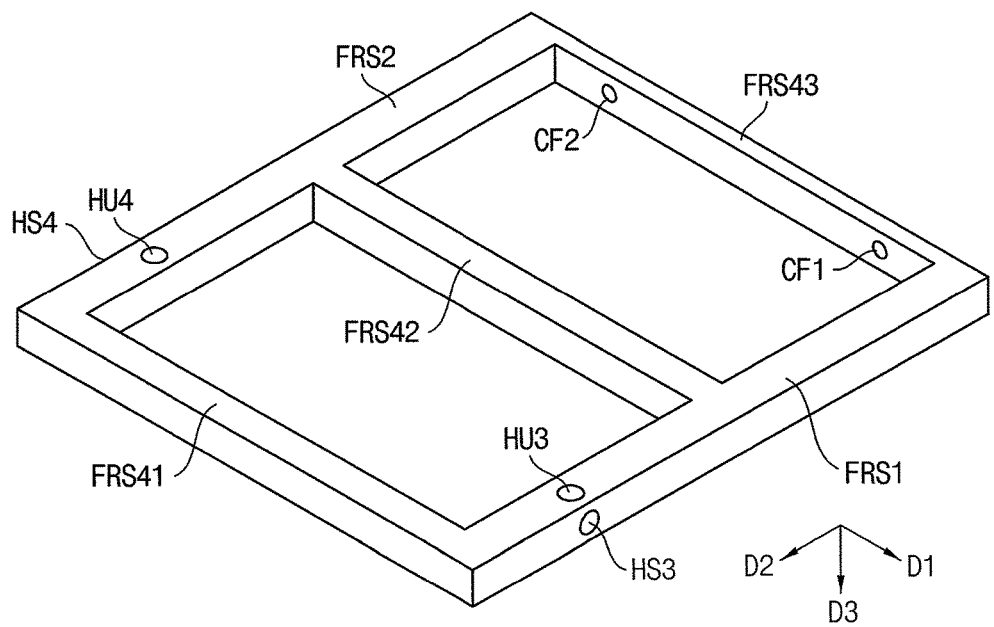
Figure 22E:
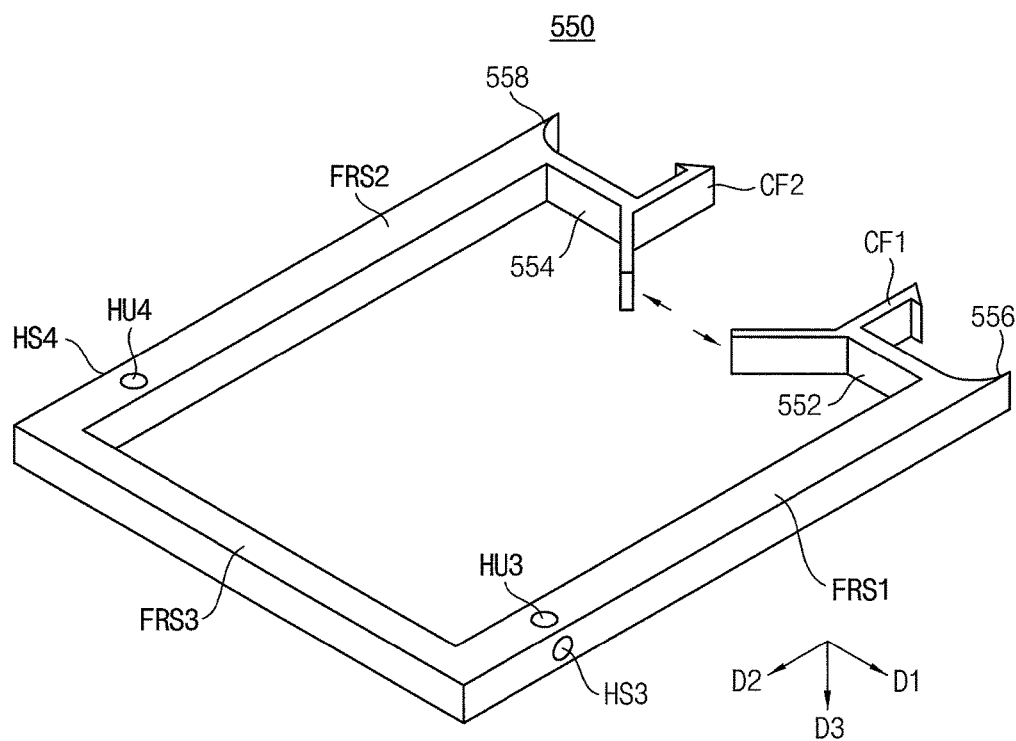

FIG. 11 illustrates an example in which the first extension joint CH1 and CH2 and the second extension joint CF1 and CF2 are combined using screws, but the first extension joint CH1 and CH2 and the second extension joint CF1 and CF2 may be combined using other means, for example, hooks as illustrated in FIG. 22e.

FIG. 12 also shows the case of the SSD housing 100 substantially in the form of a rectangular cuboid and wherein the housing 100 has top and bottom planar surfaces parallel to one another, planar side surfaces parallel to one another, a front and a back. In this example, the frame segments of the extension frame 210, namely, the first, second and third frame segments FRS1, FRS2 and FRS3 are each in the form of rods having a rectangular cross section. Each of the frame segments have top and bottom surfaces coplanar with the top and bottom surfaces of the housing 100, respectively. The first and second frame segments FRS1, FRS2 have side surfaces coplanar with the side surfaces of the housing 100, respectively. Also, the SSD assembly 11 has a joint (constituted by the aforementioned extension joints CH1, CH2 and CF1, CF2) located between the back of the of the housing 100 and the front of the of the extension frame 210 and by which the extension frame is detachably connected to the housing 100. The coplanar top surfaces of the housing 100 and the frame segments of the extension frame 210, as shown in the plan view of FIG. 12, collectively inscribe a polygon that is substantially rectangular. Likewise, the coplanar bottom surfaces of the housing 100 and the frame segments of the extension frame 210 collectively inscribe a polygon that is substantially rectangular. Again, the term "substantially rectangular" is used to indicate that the shape may be rectangular or rectangular except for rounded corners.

Figure 13:
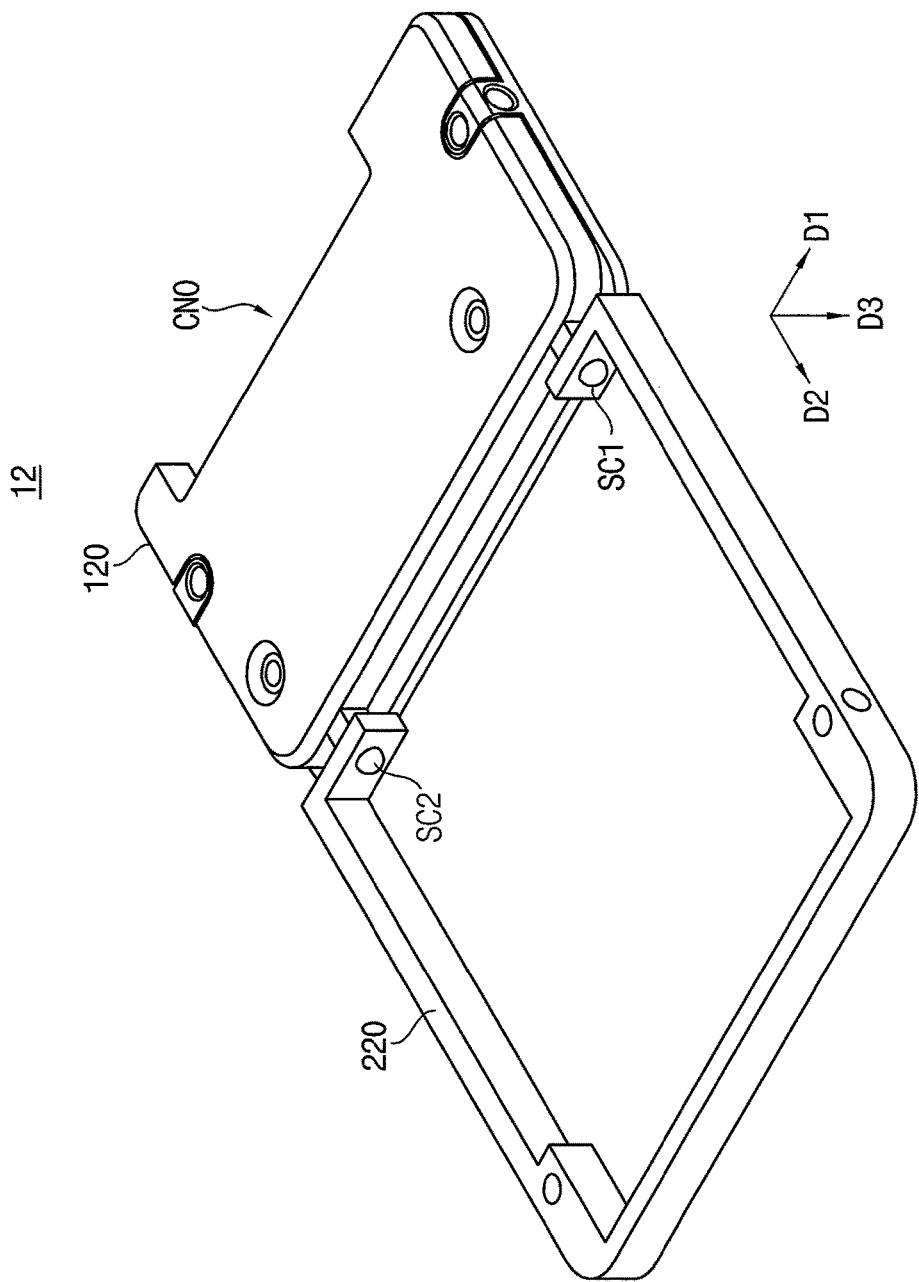
FIG. 13 is a perspective view illustrating an example of an SSD housing assembly according to the inventive concept.
Figure 14:
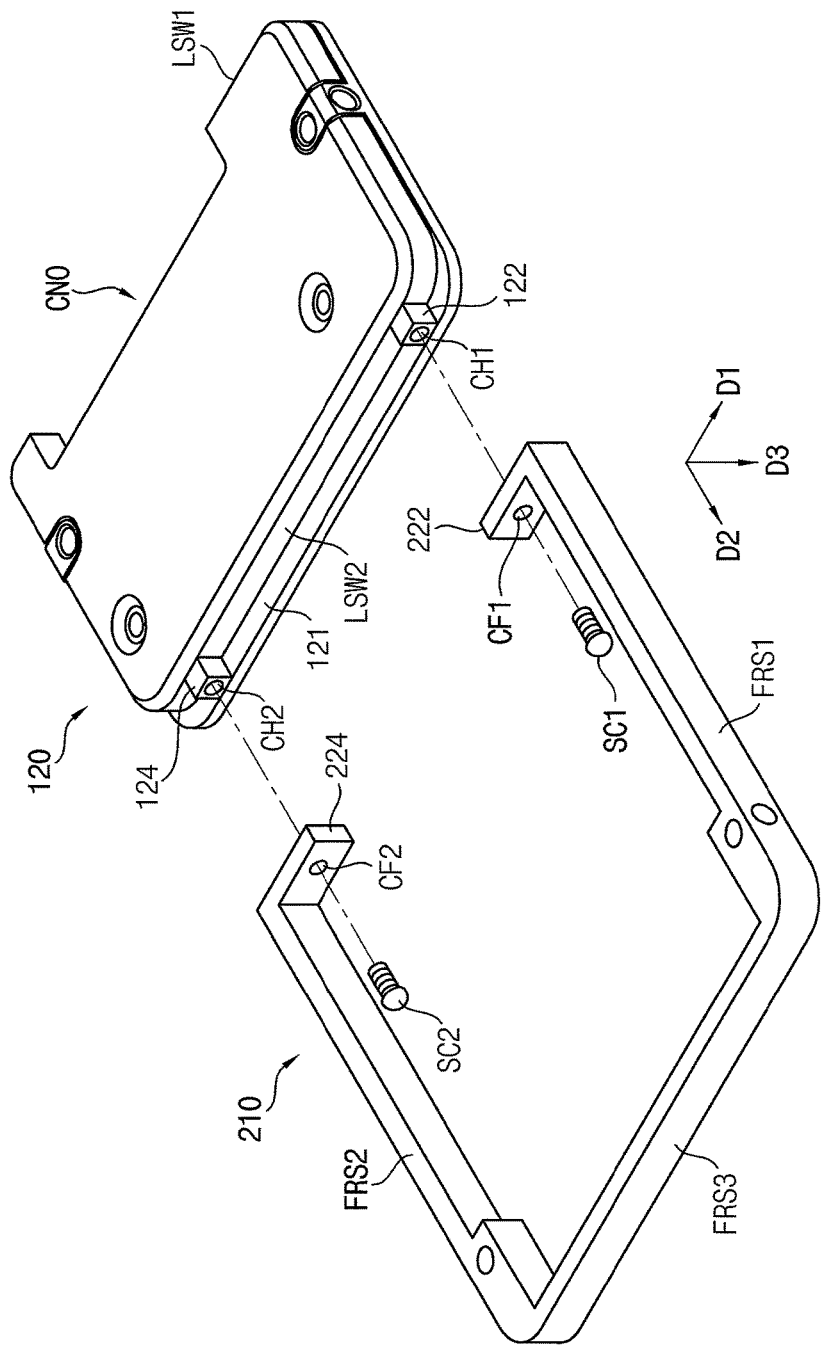
FIG. 14 is a perspective view illustrating the SSD housing assembly of FIG. 13 but in a separated or disassembled state.
Figure 15:
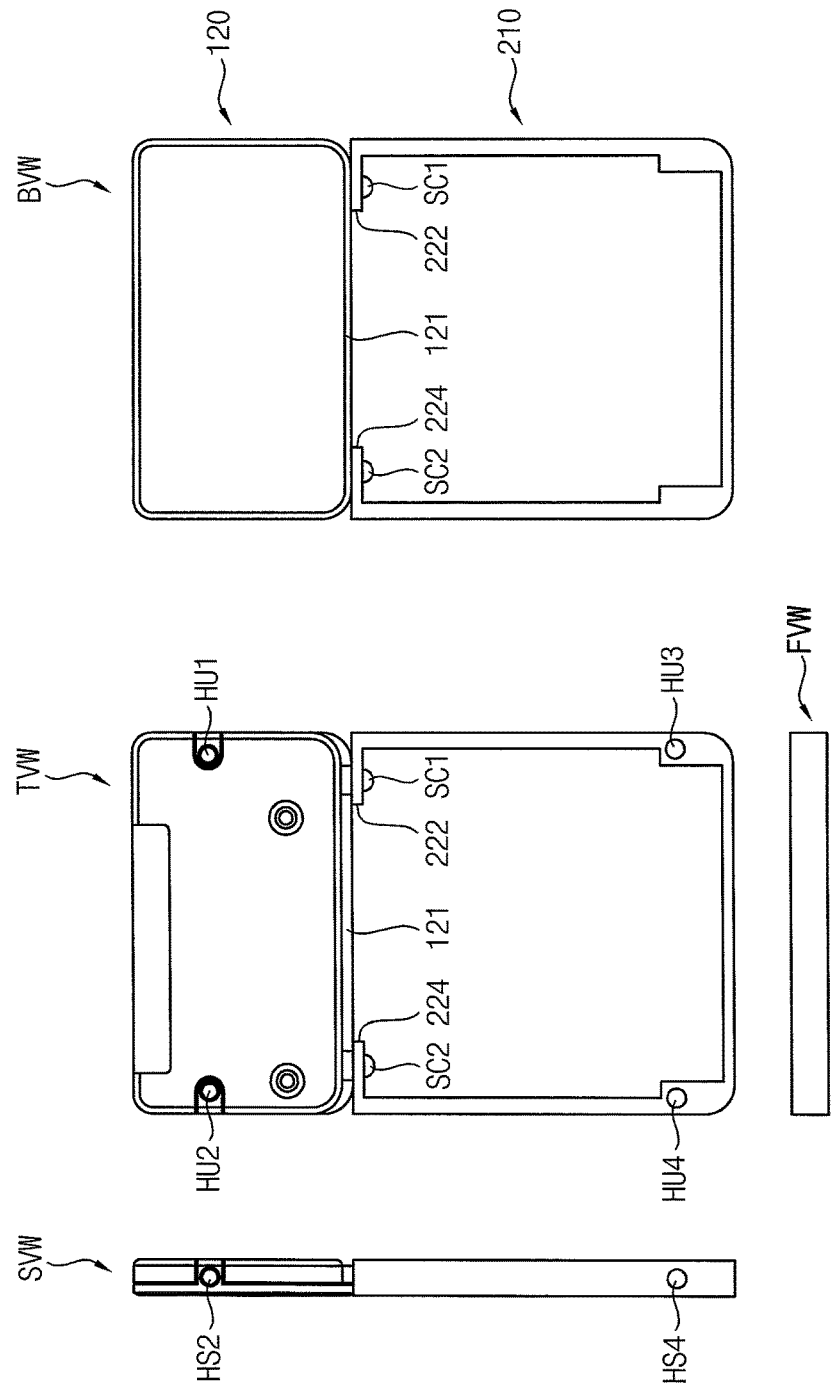
FIG. 15 is a development view of the SSD housing assembly of FIG. 13.

FIG. 13 is a perspective view illustrating an example of an SSD housing assembly according to the inventive concept, FIG. 14 is a perspective view illustrating a separated state of the SSD housing assembly of FIG. 13 and FIG. 15 is a development view of the SSD housing assembly of FIG. 13. FIG. 15 illustrates a top view TVW, a bottom view BVW, a side view SVW and a front view FVW of the SSD housing assembly 12 in the combined state of FIG. 13.

The SSD housing assembly 12 of FIG. 13 is similar to the SSD housing assembly 11 of FIG. 10, and thus descriptions of most of the similar aspects of the examples will be omitted.

Referring to FIGS. 13, 14 and 15, the SSD housing assembly 12 includes an SSD housing 120 and an extension frame 220.

The SSD housing 120 includes a first extension joint CH1 and CH2 and an mounting joint HU1, HU2, HS1 and HS2 to be combined with an external device. The SSD housing 120 has a shape of a rectangular case in which an SSD module is held as described above. The extension frame 220 includes a second extension joint CF1 and CF2 and a second mounting joint HU3, HU4, HS3 and HS4 to be combined with the external device. The length of the SSD housing 120 along the first direction D1 is equal to the length of the extension frame 220 along the first direction D1. Accordingly, the overall shape of the SSD housing assembly, including the SSD housing 120 and the extension frame 220, may be rectangular.

The second extension joint CF1 and CF2 of the extension frame 220 may be formed at contact parts 222 and 224 that extend in the first direction D1 from the proximal end portions of the first and second frame segments FRS1 and FRS2. In some examples according to the inventive concept, the second extension joint CF1 and CF2 may be formed as apertures through which screws SC1 and SC2 may penetrate the contact parts 222 and 224. A supporting plate 121 may be formed at a bottom portion of the second long side wall LSW2 of the SSD housing 120 and screw housing 122 and 124 may be formed on the upper surface of the supporting plate 121. The first extension joint CH1 and CH2 may be formed as screw holes at the front of the screw housing 122 and 124. The SSD housing 120 and the extension frame 220 may be combined by pressing the contact parts 222 and 224 to the front surface of the screw housing 122 and 124 and then securing them using the screws SC1 and SC2.

Figure 16:
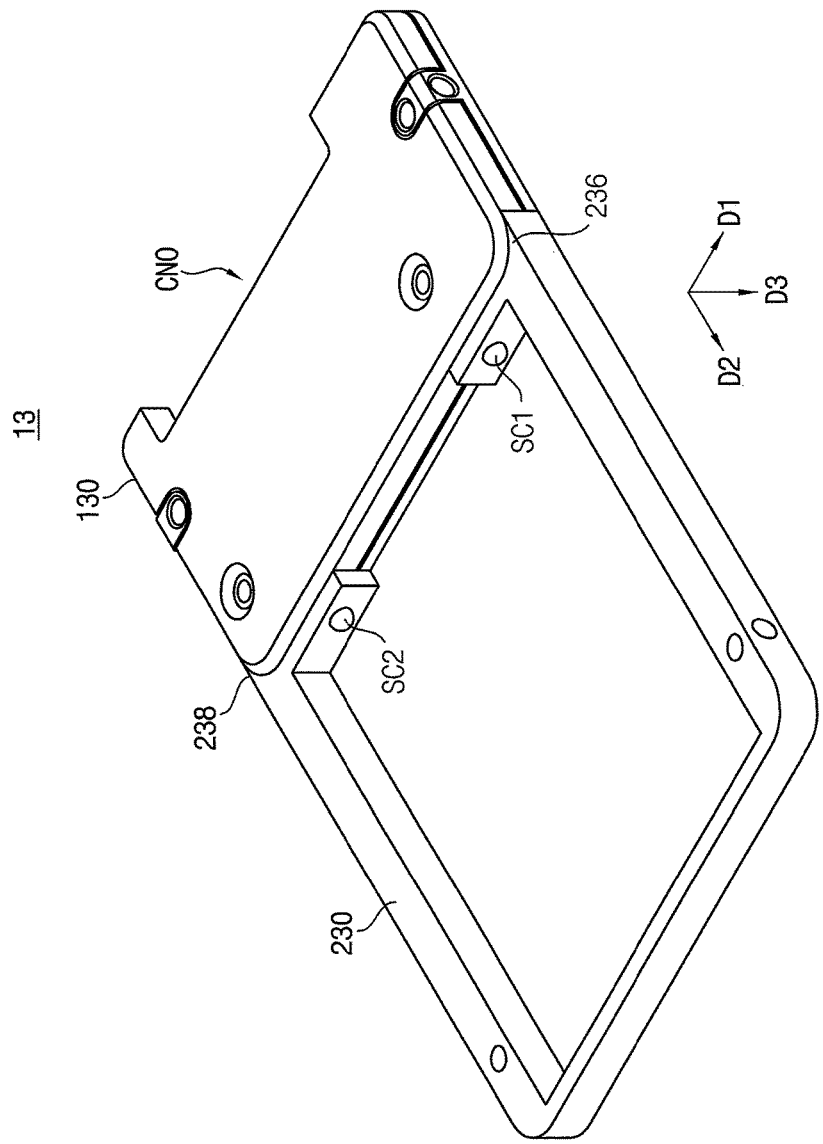
FIG. 16 is a perspective view of an example of an SSD housing assembly according to the inventive concept.
Figure 17:
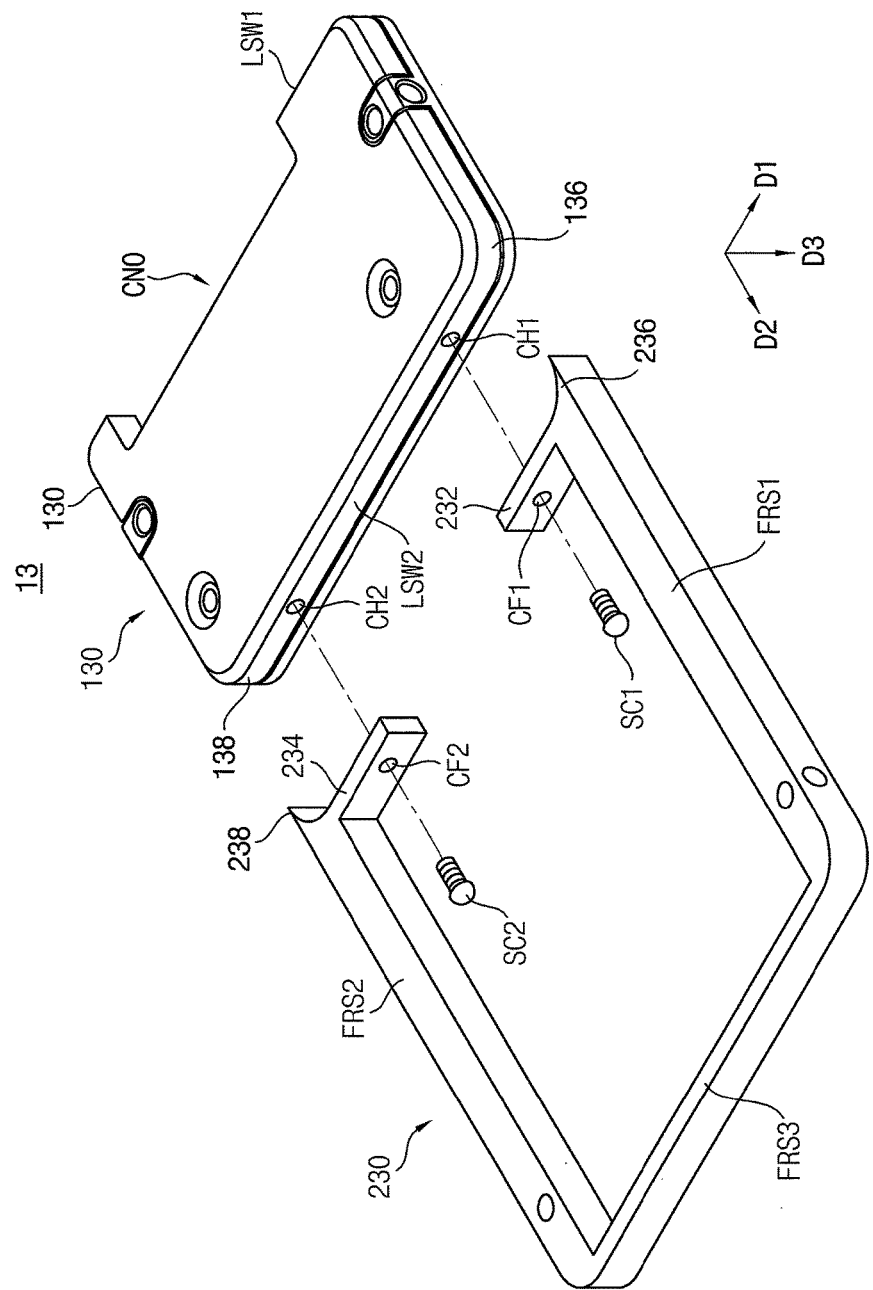
FIG. 17 is a perspective view of the SSD housing assembly of FIG. 16 but in a separated or disassembled state.
Figure 18:
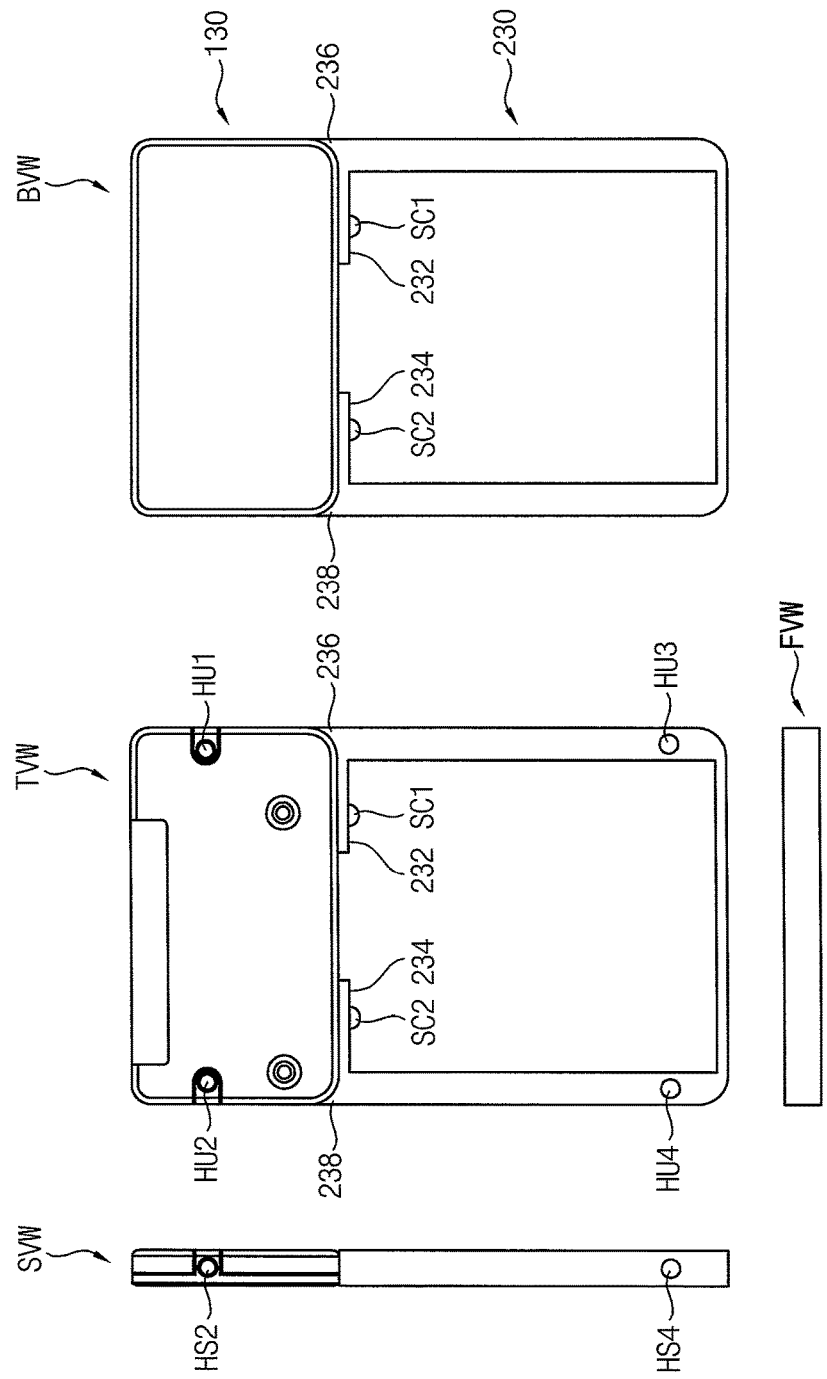
FIG. 18 is a development view of the SSD housing assembly of FIG. 16.

FIG. 16 is a perspective view illustrating an example of an SSD housing assembly according to the inventive concept, FIG. 17 is a perspective view illustrating a separated state of the SSD housing assembly of FIG. 16, and FIG. 18 is a development view of the SSD housing assembly of FIG. 16. FIG. 18 illustrates a top view TVW, a bottom view BVW, a side view SVW and a front view FVW of the SSD housing assembly 13 in the combined state of FIG. 16.

The SSD housing assembly 13 of FIG. 16 is similar to the SSD housing assembly 11 of FIG. 10, and thus descriptions of most of the similar aspects of the examples will be omitted.

Referring to FIGS. 16, 17 and 18, the SSD housing assembly 13 includes an SSD housing 130 and an extension frame 230.

The SSD housing 130 includes a first extension joint CH1 and CH2 and an mounting joint HU1, HU2, HS1 and HS2 to be combined with an external device. The SSD housing 130 has a shape of a rectangular case in which an SSD module is held as described above. The extension frame 230 includes a second extension joint CF1 and CF2 and a second mounting joint HU3, HU4, HS3 and HS4 to be combined with the external device. The length of the SSD housing 130 along the first direction D1 is equal to the length of the extension frame 230 along the first direction D1. Accordingly, the overall shape of the SSD housing assembly, including the SSD housing 130 and the extension frame 230, may be rectangular.

The second extension joint CF1 and CF2 of the extension frame 230 may be formed at contact parts 232 and 234 that extend in the first direction D1 from the proximal end portions of the first and second frame segments FRS1 and FRS2. In some examples according to the inventive concept, the second extension joint CF1 and CF2 may be formed as apertures through which screws SC1 and SC2 may penetrate the contact parts 232 and 234. The first extension joint CH1 and CH2 may be formed as screw holes at the second long side wall LSW2. The SSD housing 130 and the extension frame 230 may be combined by pressing the contact parts 232 and 234 to the second long side wall LSW2 and then securing them together using the screws SC1 and SC2.

The SSD housing 130 may have curved corner portions 136 and 138 having convex surfaces. The extension frame 230 may have curved corner portions 236 and 238 having concave surfaces that are complementary to and hence, mesh with the convex surfaces of the curved corner portions 136 and 138 of the SSD housing 130. Thus, the SSD housing 130 and the extension frame 230 may be firmly and stably held together in the combined state.

Figure 19:
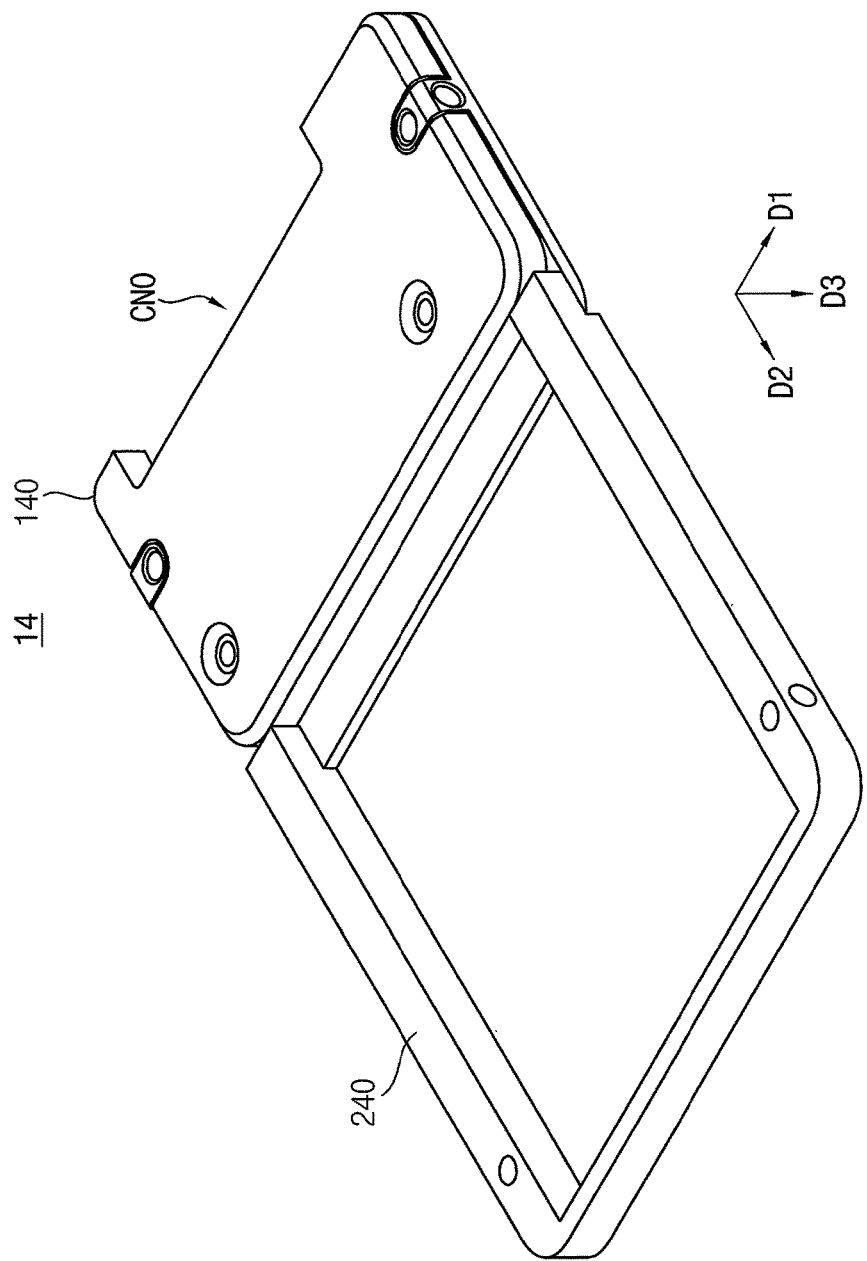
FIG. 19 is a perspective view of an example of an SSD housing assembly according to the inventive concept.
Figure 20:
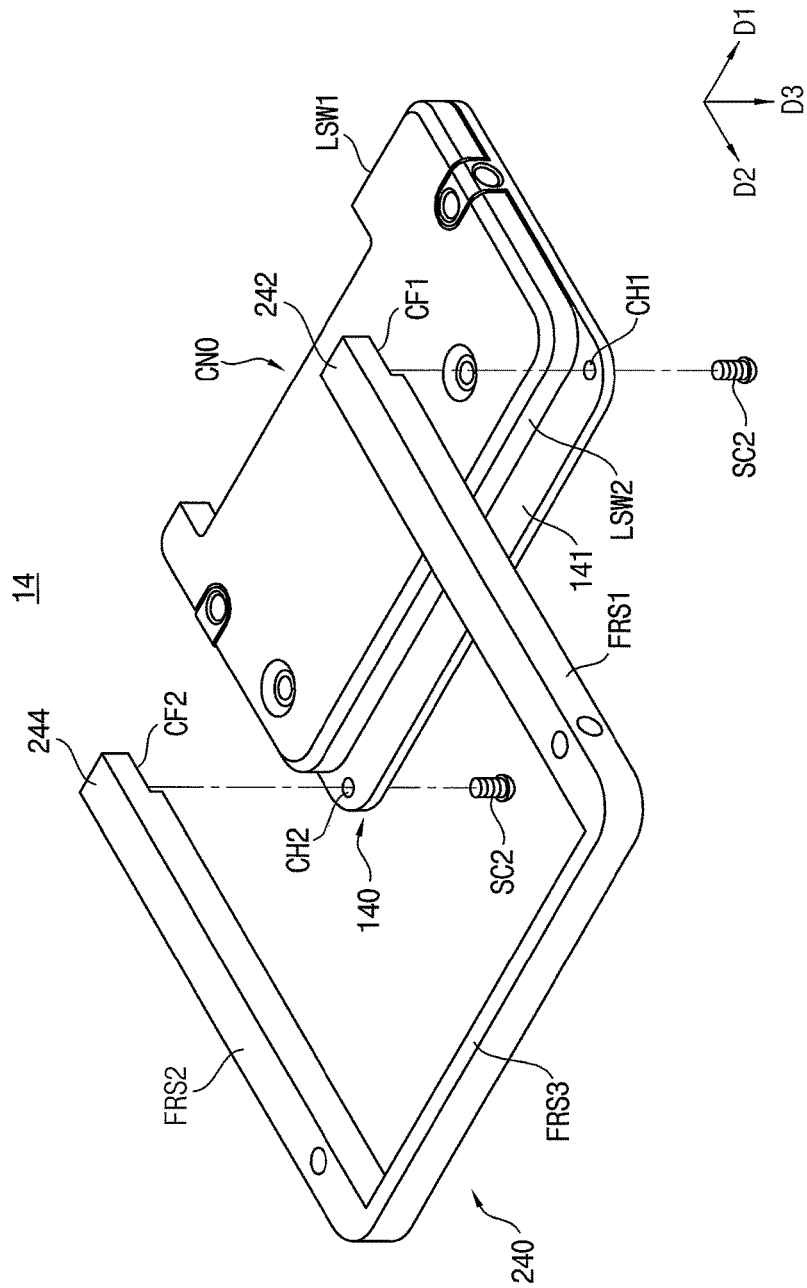
FIG. 20 is a perspective view of the SSD housing assembly of FIG. 19 but in a separated or disassembled state.
Figure 21:
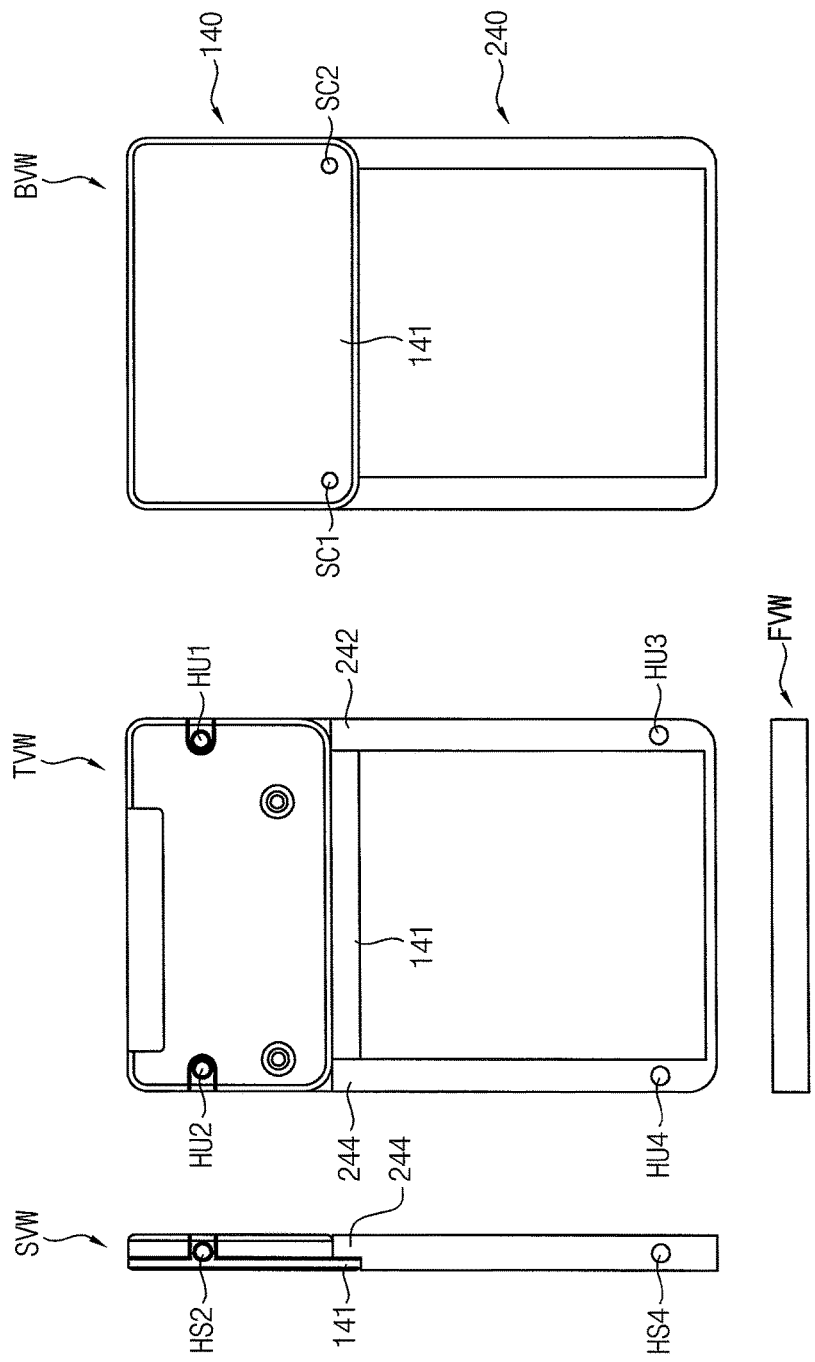
FIG. 21 is a development view of the SSD housing assembly of FIG. 19.

FIG. 19 is a perspective view illustrating an example of an SSD housing assembly according to the inventive concept, FIG. 20 is a perspective view illustrating a separated state of the SSD housing assembly of FIG. 19, and FIG. 21 is a development view of the SSD housing assembly of FIG. 19. FIG. 21 illustrates a top view TVW, a bottom view BVW, a side view SVW and a front view FVW of the SSD housing assembly 14 in the combined state of FIG. 19.

The SSD housing assembly 14 of FIG. 19 is similar to the SSD housing assembly 11 of FIG. 10, and thus descriptions of most aspects of the examples that are similar will be omitted.

Referring to FIGS. 19, 20 and 21, the SSD housing assembly 14 includes an SSD housing 140 and an extension frame 240.

The SSD housing 140 includes a first extension joint CH1 and CH2 and an mounting joint HU1, HU2, HS1 and HS2 to be combined with an external device. The SSD housing 140 has a shape of a rectangular case in which an SSD module is held as described above. The extension frame 240 includes a second extension joint CF1 and CF2 and a second mounting joint HU3, HU4, HS3 and HS4 to be combined with the external device. The length of the SSD housing 140 along the first direction D1 is equal to the length of the extension frame 240 along the first direction D1. Accordingly, the overall shape of the SSD housing assembly, including the SSD housing 140 and the extension frame 240, may be rectangular.

The second extension joint CF1 and CF2 of the extension frame 240 may be formed at the bottom of the proximal end portions 242 and 244 of the first and second frame segments FRS1 and FRS2. In some examples according to the inventive concept, the second extension joint CF1 and CF2 may be formed as screw holes to accept the screws SC1 and SC2. A supporting plate 141 may be formed at a bottom portion of the second long side wall LSW2 of the SSD housing 140 and the first extension joint CH1 and CH2 may be formed as apertures by which the screws SC1 and SC2 may penetrate the supporting plate 141. The SSD housing 140 and the extension frame 240 may be combined by pressing the proximal end portions of the first and second frame segments FRS1 and FRS2 to the upper surface of the supporting plate 141 and then securing them together using the screws SC1 and SC2.

FIGS. 22A, 22B, 22C, 22D, 22E, 23 and 24 are perspective views of examples of extension frames according to the inventive concept.

Referring to FIG. 22A, an extension frame 510 may include a first frame segment FRS1, a second frame segment FRS2 and a third frame segment FRS3.

The first frame segment FRS1 extends in the second direction D2 and a near end portion of the first frame segment FRS1 is combined with the SSD housing at a first end portion of the above-mentioned second long side wall LSW2 of the SSD housing. The second frame segment FRS2 extends in the second direction D2 and a proximal end portion of the second frame segment FRS2 is combined with the SSD housing at a second end portion of the second long side wall LSW2 of the SSD housing. The third frame segment FRS3 extends in the first direction D1 to connect the central portions of the first frame segment FRS1 and the second frame segment FRS2.

The second mounting joint HU3, HU4, HS3 and HS4 of the extension frame 510 is formed at distal end portions of the first and second frame segments FRS1 and FRS2 where the distal end portions of the first and second frame segments FRS1 and FRS2 are opposite to the proximal end portions of the first and second frame segments FRS1 and FRS2. The second extension joint CF1 and CF2 of the extension frame 510 is formed at contact parts 512 and 514 that extend in the first direction D1 from the proximal end portions of the first and second frame segments FRS1 and FRS2.

Referring to FIG. 22B, an extension frame 520 may include a first frame segment FRS1, a second frame segment FRS2, a third frame segment FRS21 and a fourth frame segment FRS22.

The first frame segment FRS1 extends in the second direction D2 and a proximal end portion of the first frame segment FRS1 is combined with the SSD housing at a first end portion of the above-mentioned second long side wall LSW2 of the SSD housing. The second frame segment FRS2 extends in the second direction D2 and a proximal end portion of the second frame segment FRS2 is combined with the SSD housing at a second end portion of the second long side wall LSW2 of the SSD housing. The third frame segment FRS21 extends in the first direction D1 to connect the distal end portions of the first frame segment FRS1 and the second frame segment FRS2. The fourth frame segment FRS22 extends in the first direction D1 to connect the central portions of the first frame segment FRS1 and the second frame segment FRS2.

The second mounting joint HU3, HU4, HS3 and HS4 of the extension frame 520 is formed at distal end portions of the first and second frame segments FRS1 and FRS2. The second extension joint CF1 and CF2 of the extension frame 520 is formed at contact parts 512 and 514 that extend in the first direction D1 from the proximal end portions of the first and second frame segments FRS1 and FRS2.

Referring to FIG. 22C, an extension frame 530 may include a first frame segment FRS1, a second frame segment FRS2, a third frame segment FRS31 and a fourth frame segment FRS32.

The first frame segment FRS1 extends in the second direction D2 and a proximal end portion of the first frame segment FRS1 is combined with the SSD housing at a first end portion of the above-mentioned second long side wall LSW2 of the SSD housing. The second frame segment FRS2 extends in the second direction D2 and a proximal end portion of the second frame segment FRS2 is combined with the SSD housing at a second end portion of the second long side wall LSW2 of the SSD housing. The third frame segment FRS31 extends in the first direction D1 to connect the central portions of the first frame segment FRS1 and the second frame segment FRS2. The fourth frame segment FRS32 extends in the first direction D1 to connect the proximal end portions of the first frame segment FRS1 and the second frame segment FRS2.

The second mounting joint HU3, HU4, HS3 and HS4 of the extension frame 530 is formed at distal end portions of the first and second frame segments FRS1 and FRS2. The second extension joint CF1 and CF2 of the extension frame 530 is formed at the fourth frame segment FR32. When the extension frame 530 is combined to the SSD housing, the fourth frame segment FRS32 may be pressed to the second long side wall LSW2 of the SSD housing and then secured to the SSD housing using the screws.

Referring to FIG. 22D, an extension frame 540 may include a first frame segment FRS1, a second frame segment FRS2, a third frame segment FRS41, a fourth frame segment FRS42 and a fifth frame segment FRS43.

The first frame segment FRS1 extends in the second direction D2 and a proximal end portion of the first frame segment FRS1 is combined with the SSD housing at a first end portion of the above-mentioned second long side wall LSW2 of the SSD housing. The second frame segment FRS2 extends in the second direction D2 and a proximal end portion of the second frame segment FRS2 is combined with the SSD housing at a second end portion of the second long side wall LSW2 of the SSD housing. The third frame segment FRS41 extends in the first direction D1 to connect the distal end portions of the first frame segment FRS1 and the second frame segment FRS2. The fourth frame segment FRS42 extends in the first direction D1 to connect the central portions of the first frame segment FRS1 and the second frame segment FRS2. The fifth frame segment FRS43 extends in the first direction D1 to connect the proximal end portions of the first frame segment FRS1 and the second frame segment FRS2.

The second mounting joint HU3, HU4, HS3 and HS4 of the extension frame 540 is formed at distal end portions of the first and second frame segments FRS1 and FRS2. The second extension joint CF1 and CF2 of the extension frame 540 is formed at the fifth frame segment FR43. When the extension frame 540 is combined to the SSD housing, the fifth frame segment FRS43 may be pressed to the second long side wall LSW2 of the SSD housing and secured thereto using the screws.

Referring to FIG. 22E, an extension frame 550 may include a first frame segment FRS1, a second frame segment FRS2 and a third frame segment FRS3.

The first frame segment FRS1 extends in the second direction D2 and a proximal end portion of the first frame segment FRS1 is combined with the SSD housing at a first end portion of the above-mentioned second long side wall LSW2 of the SSD housing. The second frame segment FRS2 extends in the second direction D2 and a proximal end portion of the second frame segment FRS2 is combined with the SSD housing at a second end portion of the second long side wall LSW2 of the SSD housing. The third frame segment FRS3 extends in the first direction D1 to connect the distal end portions of the first frame segment FRS1 and the second frame segment FRS2.

The second mounting joint HU3, HU4, HS3 and HS4 of the extension frame 550 is formed at distal end portions of the first and second frame segments FRS1 and FRS2. The second extension joint CF1 and CF2 of the extension frame 550 is formed at contact parts 552 and 554 that extend in the first direction D1 from the proximal end portions of the first and second frame segments FRS1 and FRS2. Also, the proximal end portions of the first and second frame segments FRS1 and FRS2 may have curved corner portions 556 and 58 having concave surfaces that mesh with the convex surfaces of the curve corner portions of the SSD housing, as described above.

As illustrated in FIG. 22E, the second extension joint CF1 and CF2 may be formed as hooks. In this case, the above mentioned first extension joint CH1 and CH2 of the SSD housing may be formed as holes that expand internally so that the hooks may be inserted into the holes and engaged with the house in the holes to provide a snap fit. The extension frame 550 may be attached to the SSD housing by pushing the extension frame 550 toward the SSD housing, and the extension frame 550 may be detached from the SSD housing by pressing the hook ends in the directions of arrows and pulling the extension frame 550 away from the SSD housing.

Figure 23:
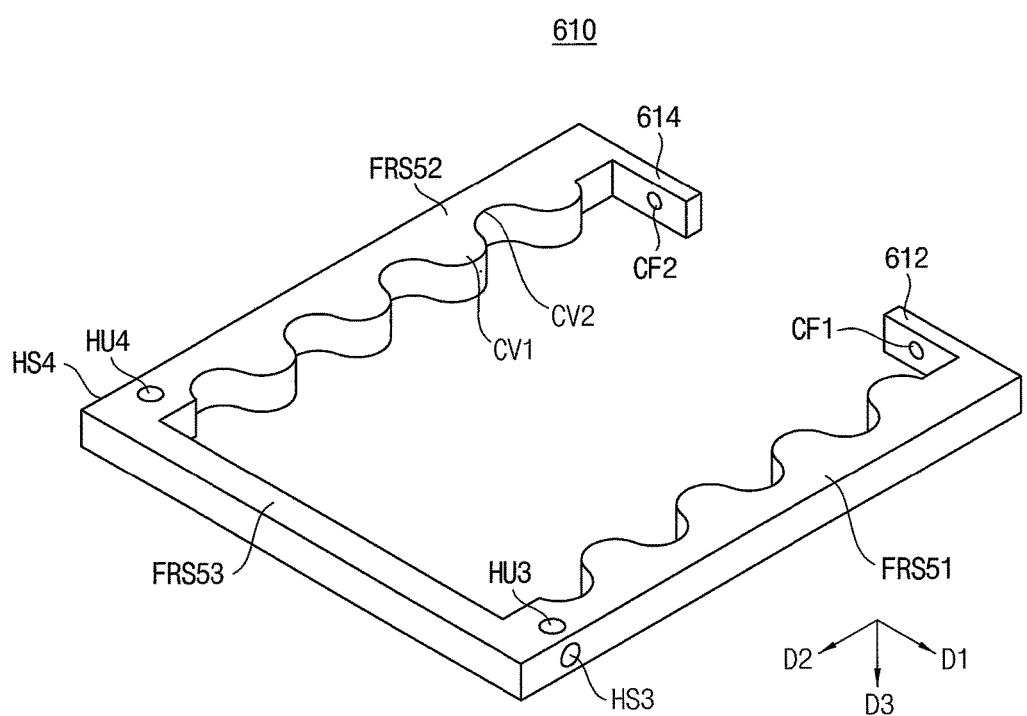

Referring to FIG. 23, an extension frame 610 may include a first frame segment FRS51, a second frame segment FRS52 and a third frame segment FRS53.

The first frame segment FRS51 extends in the second direction D2 and a proximal end portion of the first frame segment FRS51 is combined with the SSD housing at a first end portion of the above-mentioned second long side wall LSW2 of the SSD housing. The second frame segment FRS52 extends in the second direction De and a proximal end portion of the second frame segment FRS52 is combined with the SSD housing at a second end portion of the second long side wall LSW2 of the SSD housing. The third frame segment FRS53 extends in the first direction D1 to connect the far end portions of the first frame segment FRS51 and the second frame segment FRS52.

As illustrated in FIG. 23, each of the first and second frame segments FRS51 and FRS52 may have an undulating structure of convex portions CV1 and concave portions CV2 that are repeated alternatively to increase a surface area of the first and second frame segments FRS51 and FRS52 for dissipating heat.

The second mounting joint HU3, HU4, HS3 and HS4 of the extension frame 610 is formed at distal end portions of the first and second frame segments FRS51 and FRS52. The second extension joint CF1 and CF2 of the extension frame 610 is formed at contact parts 612 and 614 that extend in the first direction D1 from the proximal end portions of the first and second frame segments FRS51 and FRS52.

Figure 24:
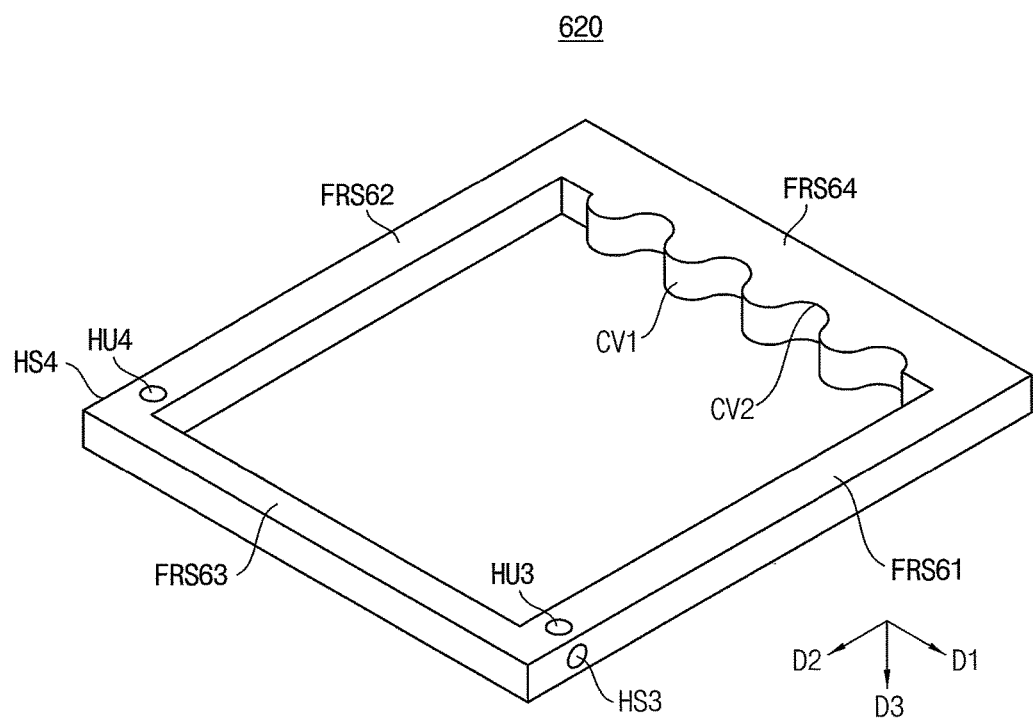

Referring to FIG. 24, an extension frame 620 may include a first frame segment FRS61, a second frame segment FRS62, a third frame segment FRS63 and a fourth frame segment FRS64.

The first frame segment FRS61 extends in the second direction D2 and a proximal end portion of the first frame segment FRS61 is combined with the SSD housing at a first end portion of the above-mentioned second long side wall LSW2 of the SSD housing. The second frame segment FRS62 extends in the second direction D2 and a proximal end portion of the second frame segment FRS62 is combined with the SSD housing at a second end portion of the second long side wall LSW2 of the SSD housing. The third frame segment FRS63 extends in the first direction D1 to connect the distal end portions of the first frame segment FRS61 and the second frame segment FRS62. The fourth frame segment FRS64 extends in the first direction D1 to connect the proximal end portions of the first frame segment FRS61 and the second frame segment FRS62.

One side wall of the fourth frame segment FRS 64 may contact the second long side wall of the SSD housing when the SSD housing and the extension frame 620 are combined. As illustrated in FIG. 24, another side wall of the fourth frame segment FRS64 may have an undulating structure of convex portions CV1 and concave portions CV2 that are repeated alternatively to increase a surface area of the fourth frame segment FRS64 for dissipating heat.

The second mounting joint HU3, HU4, HS3 and HS4 of the extension frame 620 is formed at distal end portions of the first and second frame segments FRS51 and FRS52. The second extension joint CF1 and CF2 (not shown) of the extension frame 620 is formed at the bottom of the fourth frame segment FRS64 or the proximal end portions of the first and second frame segments FRS61 and FRS62.

In some examples according to the inventive concept, the frame segments having the heat dissipating structure as illustrated in FIGS. 23 and 24 may be formed of high-conductivity materials such as metal. In other examples according to the inventive concept, the frame segments may be formed of chip materials such as plastic for reducing manufacturing costs.

Figure 25:
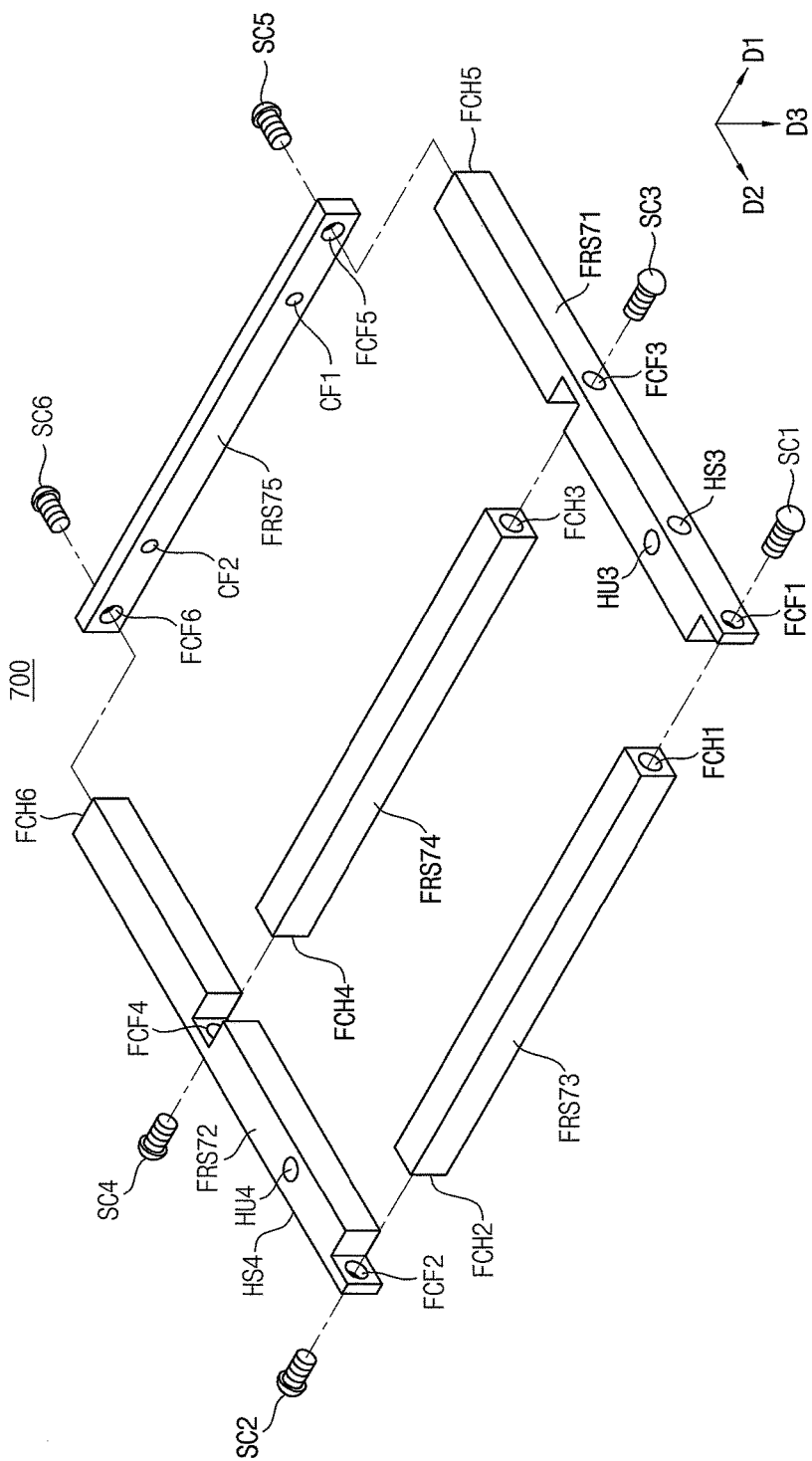
FIG. 25 is a perspective view of an example of an extension frame, according to the inventive concept, but in a separated or disassembled state.
Figure 26:
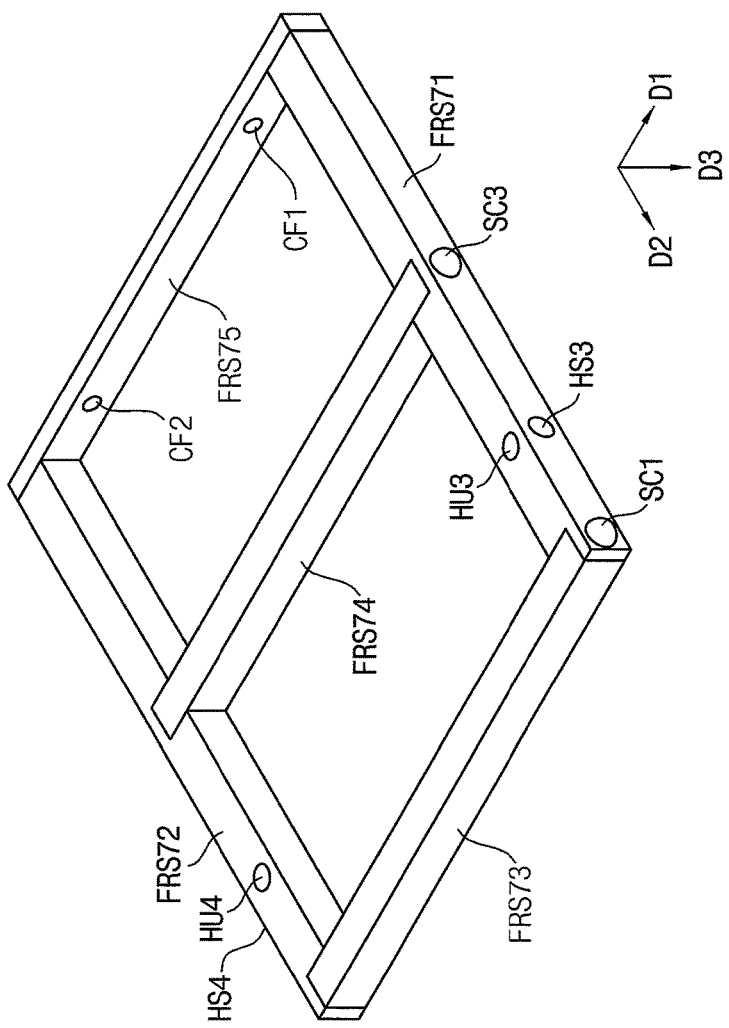
FIG. 26 is a perspective view of the extension frame of FIG. 25.

FIG. 25 is an exploded perspective view of an example of an extension frame according to the inventive concept, and FIG. 26 is a perspective view of the extension frame of FIG. 25.

Referring to FIGS. 25 and 26, an extension frame 700 may include first through fifth frame segments FRS71 through FRS75, which are individual and distinct components.

The first through fifth frame segments FRS71 through FRS75 may be combined using screws SC1~SC6, apertures FCF1~FCF6 and screw holes FCH1~FCH6. Accordingly, at least one of the frame segments may be attachable to and detachable from another of the frame segments.

The second mounting joint HU3, HU4, HS3 and HS4 of the extension frame 700 is formed at distal end portions of the first and second frame segments FRS71 and FRS72. The second extension joint CF1 and CF2 of the extension frame 700 is formed at the fifth frame segment FRS75.

In other examples of the extension frame 700 of FIGS. 25 and 26, at least one of the third and fourth frame segments FRS73 and FRS74 is omitted.

Figure 27:
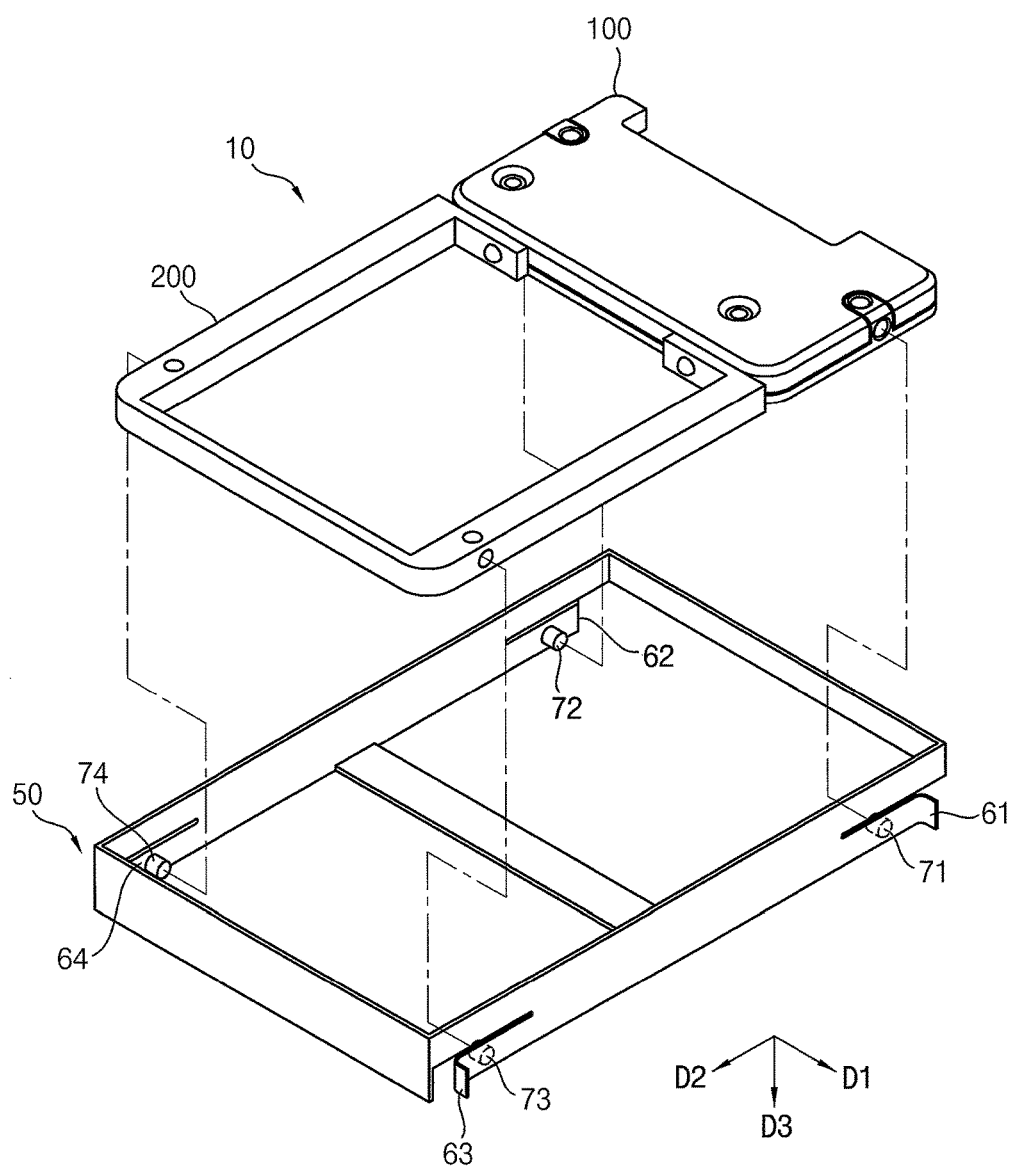
FIG. 27 is a perspective view of an example of an SSD housing assembly according to the inventive concept.

FIG. 27 is diagram illustrating an example of a manner in which an SSD housing assembly according to the inventive concept is used.

Referring to FIG. 27, an SSD housing assembly 10 according to the inventive concept may be mounted in a cartridge 50. The cartridge 50 may be fixed to a system or detachable from the system. For example, the cartridge 50 may include tabs including hooks 61, 62, 63 and 64 and/or protrusions 71, 72, 73 and 74. The protrusions 71, 72, 73 and 74 may be received in the mounting holes HS1, HS2, HS3 and HS4 that are formed at the side walls of the SSD housing assembly 10 to combine the SSD housing assembly 10 and the cartridge 50.

If only the SSD housing 100 were mounted to the cartridge 50, the small-sized SSD housing 100 may not be firmly and stably supported by the cartridge 50. The extension frame 200 may be combined with the SSD housing 100 to form the full-sized SSD housing assembly 10, and then the combined assembly 10 may be mounted firmly and stable to the cartridge 50.

As described above, an SSD housing 100 according to the inventive concept may correspond at least dimensionally to that of a conventional small-sized SSD, and the housing 100 but may be used in various systems by securing the extension frame 200 to the housing 100. In the cases of the SSD housing 100 or the SSD housing assembly including the same, an SSD module may be used with high efficiency, i.e., without compromising its integrity, or at a low cost.

Figure 28:
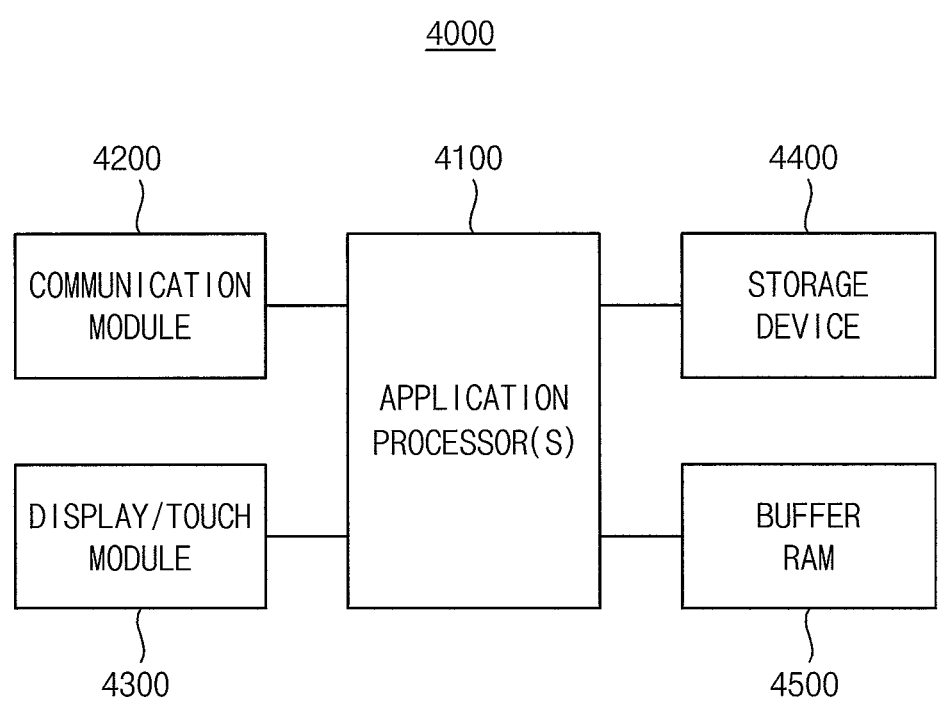
FIG. 28 is a block diagram of a mobile device having an example of an SSD, according to the inventive concept.

FIG. 28 is a block diagram of a mobile device according to the inventive concept.

Referring to FIG. 28, a mobile device 4000 may include an application processor 4100, a communication module 4200, a display/touch module 4300, a storage device 4400, and a mobile RAM 4500.

The application processor 4100 controls operations of the mobile device 4000. The communication module 4200 is implemented to perform wireless or wire communications with an external device. The display/touch module 4300 is implemented to display data processed by the application processor 4100 or to receive data through a touch panel. The storage device 4400 is implemented to store user data. The storage device 4400 may be an eMMC, an SSD, an UFS device, etc. The storage device 4400 may include an SSD housing assembly containing an SSD module according to the inventive concept. The mobile RAM 4500 temporarily stores data used for processing operations of the mobile device 4000.

The SSD module may include a packaged memory of any of various package types or package configurations, such as Package on Package (PoP), Ball Grid Array (BGA), Chip Scale Package (CSP), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

Although the inventive concept has been described above as applicable to a mobile device, the applications are not limited to mobile devices or any particular type of mobile device. Rather, the inventive concept may be applied to various types of devices and systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

Finally, although the inventive concept has been described with reference to various examples thereof, it will be apparent to those of ordinary skill in the art that various changes in form and detail may be made to such examples without departing from the spirit and scope of the inventive concept as defined by the following claims.

What is claimed is:

1. A solid state drive (SSD) housing assembly comprising:
   an SSD housing including a first extension joint part and a first mounting joint part, the first mounting joint part standardized to physically connect with an external device, and the SSD housing comprising a rectangular case configured to receive an SSD module; and
   an extension frame including a second extension joint part and a second mounting joint part, the second mounting joint part standardized to physically connect with the external device, and
   wherein the second extension joint part and the first extension joint part constitute a joint by which the extension frame is detachably attached to the SSD housing.

2. The SSD housing assembly of claim 1, and satisfying small form factor (SFF) standards for dimensions of disk drives.

3. The SSD housing assembly of claim 1, wherein the first mounting joint part and the second mounting joint part are mounting holes.

4. The SSD housing assembly of claim 3, wherein the mounting holes satisfy small form factor (SFF) standards for dimensions of disk drives.

5. The SSD housing assembly of claim 1, wherein the extension frame includes:
   a plurality of frame segments, each frame segment having a shape of a rod.

6. The SSD housing assembly of claim 5, wherein at least one of the frame segments is detachably connected to another of the frame segments.

7. The SSD housing assembly of claim 5, wherein at least one of the frame segments has an undulating structure of convex portions and concave portions that are alternately disposed in a direction of a longitudinal axis of the frame segment to provide a surface facilitating a dissipating of heat from the extension frame.

8. The SSD housing assembly of claim 1, wherein the SSD housing has first and second long side walls that are parallel in a first direction and opposite to each other, and first and second short side walls that are parallel in a second direction perpendicular to the first direction and opposite to each other,
   wherein the first long side wall has a connector opening therein where a connector of an SSD module received by the case is exposed, and
   wherein the first extension joint part is disposed along the second long side wall.

9. The SSD housing assembly of claim 8, wherein a length of the SSD housing along the first direction is equal to a length of the extension frame along the first direction.

10. The SSD housing assembly of claim 8, wherein the extension frame includes:
    a first frame segment extending in the second direction and having a proximal end portion adjacent to the SSD housing and a distal end portion remote from the SSD housing, the proximal end portion of the first frame segment adjoining the SSD housing at a first end portion of the second long side wall of the SSD housing; and
    a second frame segment extending in the second direction and having a proximal end portion adjacent to the SSD housing and a distal end portion remote from the SSD housing, the proximal end portion of the second frame segment adjoining the SSD housing at a second end portion of the second long side wall of the SSD housing.

11. The SSD housing assembly of claim 1, wherein the joint comprises a screw and a tapped hole in which the screw is received and by which the extension frame is detachably connected to the SSD housing.

12. The SSD housing assembly of claim 1, wherein the joint comprises a hook and an opening in which the hook is received and by which the extension frame is detachably connected to the SSD housing.

13. The SSD housing assembly of claim 1, wherein the SSD housing has curved corners formed by convex surfaces, and
wherein the extension frame has concave surfaces that are complementary to and mesh with the convex surfaces of the SSD housing.

14. A solid state drive (SSD) device comprising the SSD housing as claimed in claim 1 and the SSD module received by the SSD housing,
wherein the SSD module includes a solid state memory disposed within the rectangular case, and an external electrical connector exposed at the outside of the rectangular case and by which the solid state memory can communicate with the external device.

15. A solid state drive (SSD) housing comprising:
a case substantially in the form of a rectangular cuboid and configured to receive therein an SSD module,
wherein the case has top and bottom planar surfaces parallel to one another, a front and back constituted by first and second side long side walls, respectively, and which are parallel in a first direction and opposite to each other, first and second short side walls that are parallel in a second direction perpendicular to the first direction and opposite to each other, and an opening therein at the front of the case,
the first and second long side walls having a length in the first direction, and the first and second short side walls having a length in the second direction that is less than the length of the first and second long side walls such that a maximum dimension of the SSD housing in the first direction is greater than a maximum dimension of the SSD housing in the second direction;
a first mounting joint part integral with the case and exposed at a location between the first and second long side walls, the first mounting joint part being standardized for physical connection with an external device; and
an extension joint part integral with the case and exposed at the back of the case, the extension joint part constituting part of a joint by which an extension frame can be detachably connected to the rectangular case as projecting in the second direction from the second long side wall of the case.

16. A solid state drive (SSD) comprising the SSD housing as claimed in claim 15 and the SSD module received by the SSD housing,
wherein the SSD module includes a solid state memory disposed within the case, and an external electrical connector exposed at the front of the case and by which the solid state memory can communicate with the external device.

17. A solid state drive (SSD) assembly, comprising:
an SSD housing comprising a case substantially in the form of a rectangular cuboid and dedicated to receive an SSD module having a solid state memory, the housing having top and bottom planar surfaces parallel to one another, planar side surfaces parallel to one another, a front and a back; and
an extension frame having top and bottom surfaces coplanar with the top and bottom planar surfaces of the housing, respectively, side surfaces coplanar with the side surfaces of the housing, respectively, a front and a back, and
wherein the SSD assembly has a joint located between the back of the of the housing and the front of the of the extension frame and by which the extension frame is detachably connected to the housing, and
the coplanar top surfaces of the housing and the extension frame collectively inscribe a polygon that is substantially rectangular, and the coplanar bottom surfaces of the housing and the extension frame collectively inscribe a polygon that is substantially rectangular.

18. The solid state drive (SSD) assembly of claim 17, wherein the joint comprises mating screw threads or a snap fit by which the extension frame is detachably connected to the SSD housing.

19. The solid state drive (SSD) assembly of claim 17, wherein the front and back of the SSD housing run in a first direction and the side surfaces of the SSD housing are parallel in a second direction perpendicular to the first direction,
a maximum dimension of the SSD housing in the first direction is greater than a maximum dimension of the SSD housing in the second direction,
the maximum dimension of the SSD housing in the first direction is equal to a maximum dimension of the extension frame in the first direction, and
the extension frame includes first and second frame segments each in the form of a rod having a rectangular cross section,
the first frame segment extending longitudinally in the second direction and having a proximal end portion adjacent to the SSD housing and a distal end portion remote from the SSD housing, the proximal end portion of the first frame segment adjoining the SSD housing at a first end portion of the back of the SSD housing, and
the second frame segment extending longitudinally in the second direction and having a proximal end portion adjacent to the SSD housing and a distal end portion remote from the SSD housing, the proximal end portion of the second frame segment adjoining the SSD housing at a second end of the back of the SSD housing.

20. A solid state drive (SSD) comprising the SSD housing as claimed in claim 19 and the SSD module received by the SSD housing,
wherein the SSD module includes a solid state memory disposed within the case of the SSD module, and an external electrical connector exposed at the outside of the case and by which the solid state memory can communicate with an external device.

* * * * *